US008338280B2

(12) United States Patent
Tan et al.

(10) Patent No.: US 8,338,280 B2
(45) Date of Patent: Dec. 25, 2012

(54) METHOD FOR FABRICATING NANO DEVICES

(75) Inventors: Dexter Tan, Singapore (SG); Kin Leong Pey, Singapore (SG); Sai Hooi Yeong, Singapore (SG); Yoke King Chin, Singapore (SG); Kuang Kian Ong, Singapore (SG); Chee Mang Ng, Singapore (SG)

(73) Assignees: GLOBALFOUNDRIES Singapore Pte. Ltd., Singapore (SG); Nanyang Technological University, Singapore (SG)

( * ) Notice: Subject to any disclaimer, the term of this patent is extended or adjusted under 35 U.S.C. 154(b) by 190 days.

(21) Appl. No.: 12/832,082

(22) Filed: Jul. 8, 2010

(65) Prior Publication Data

US 2012/0009749 A1    Jan. 12, 2012

(51) Int. Cl.
   *H01L 21/425* (2006.01)
(52) U.S. Cl. ............... 438/514; 257/E21.404; 977/779
(58) Field of Classification Search .......... 438/510, 438/514, 519, 526–527; 257/E21.135–E21.153, 257/E21.404; 977/762–766, 773–779
   See application file for complete search history.

(56) References Cited

U.S. PATENT DOCUMENTS

| | | | |
|---|---|---|---|
| 6,180,476 B1 * | 1/2001 | Yu | 438/305 |
| 6,897,118 B1 * | 5/2005 | Poon et al. | 438/303 |
| 2006/0008942 A1 * | 1/2006 | Romano et al. | 438/99 |
| 2006/0019471 A1 * | 1/2006 | Choi | 438/486 |
| 2009/0280626 A1 * | 11/2009 | Zhu et al. | 438/479 |
| 2011/0031555 A1 * | 2/2011 | Shih et al. | 257/369 |
| 2011/0193183 A1 * | 8/2011 | Agarwal et al. | 257/414 |
| 2011/0236833 A1 * | 9/2011 | Chan | 430/312 |

OTHER PUBLICATIONS

Kim et al, Applied Physics Letters, vol. 79, No. 23, Dec. 3, 2001, pp. 3812-3814.*
Dae Hwan Kim et al., Room Temperature Coulomb Oscillation of a Single Electron Switch with an Electrically Formed Quantum Dot and Its Modeling, Jpn. J. Appl. Phys. vol. 39 (2000), Part 1, No. 4B, Apr. 2000,The Japan Society of Applied Physics, pp. 2329-2333.
Konstantin K. Likharev, Single-Electron Devices and Their Applications, Proceedings of the IEEE, vol. 87, No. 4, Apr. 1999, pp. 606-632.
Karl F. Goser et al., Aspects of Systems and Circuits for Nanoelectronics, Proceedings of the IEEE, vol. 85, No. 4, Apr. 1997, pp. 558-573.
Dae Hwan Kim et al., Fabrication of single-electron tunneling transistors with an electrically formed Coulomb island in a silicon-on-insulator nanowire, J.Vac. Sci. Technol. B 20(4), Jul./Aug. 2002, American Vacuum Society, pp. 1410-1418.
L.G. Jacobsohn et al., A New Pathway for Si Nanocrystal Formation: Oxi-Reduction Induced by Impurity Implantation, Mat. Res. Soc. Symp. Proc. vol. 777, 2003, Materials Research Society, pp. T7.3.1-T7.3.2 and U8/4/4-U/8/4/7.
B. Pivac et al., GISAXS study of Si nanocrystals formation in SiO2 thin films, Thin Solid Films 515, 2006, pp. 756-758. T. Hama et al., Low temperature formation of luminescent Si nanocrystals in SiO2 with rapid thermal anneals, Rep Res Cent Ion Beam Technol, Hosei Univ. Suppl, vol. No. 24, 2006, pp. 7-12.

* cited by examiner

*Primary Examiner* — Matthew W Such
*Assistant Examiner* — Ali Naraghi
(74) *Attorney, Agent, or Firm* — Horizon IP Pte Ltd

(57) ABSTRACT

Embodiments relate to a method for fabricating nano-wires in nano-devices, and more particularly to nano-device fabrication using end-of-range (EOR) defects. In one embodiment, a substrate with a surface crystalline layer over the substrate is provided and EOR defects are created in the surface crystalline layer. One or more fins with EOR defects embedded within is formed and oxidized to form one or more fully oxidized nano-wires with nano-crystals within the core of the nano-wire.

21 Claims, 28 Drawing Sheets

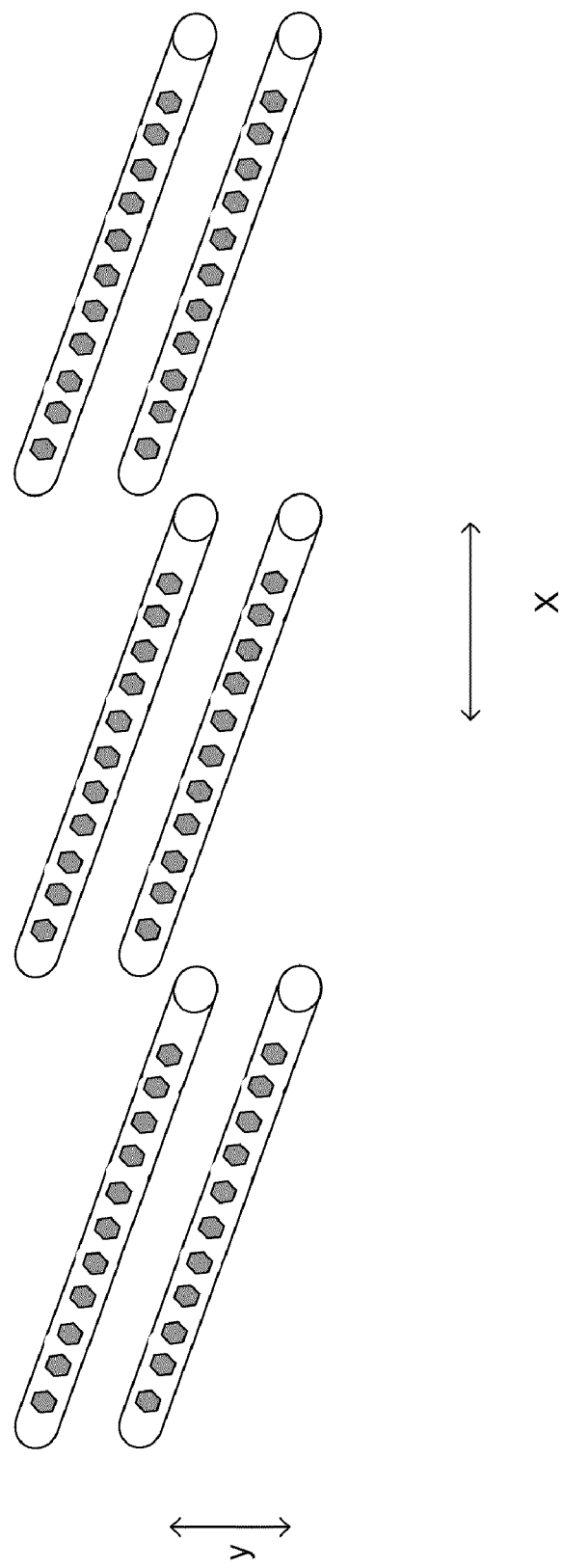

US 8,338,280 B2

METHOD FOR FABRICATING NANO DEVICES

BACKGROUND

Integrated circuits (ICs) comprising many tens of thousands of semiconductor devices including conventional complementary metal-oxide semiconductor (CMOS) transistors are a cornerstone of modern microelectronic systems. As the technology node enters into the 22 nm dimension, the specific device requirements become increasingly more stringent and CMOS transistors might not be able to accommodate to the futuristic specifications. It has long been contemplated that a change of transistor's architecture will come to address the current technology's limitations.

The single electron tunneling transistor (SET) is one of the potential novel devices which have recently received much attention due to their small size, unique device functionality and low power consumption. The SET typically transports charges across the source to the drain via nano-size single quantum dot (QD). The operation mechanism is based on the Coulomb blockade effect on a nano-scale conduction island which causes strong suppression of the tunneling charge until the island is discharged by exactly one charge.

Typically SETs are fabricated by using lithography methods to define the QD followed by reactive ion etching (RIE) to form the Coulomb islands. However, the sizes of the Coulomb islands obtainable are greatly limited by the lithography process as well as the controllability of the chemical vapor deposition (CVD) and the RIE. Other fabrication techniques that involve using implantation into $SiO_2$ encounter difficulties to place the implanted species accurately and precisely within the miniature nano-wire structure.

The conventional single-QD-based SETs depict poor stability in the Coulomb blockade effect due to the inevitable quantum mechanical co-tunneling process. This results in a higher leakage current in such devices. Nano-crystal formation by implantation of Si into $SiO_2$ was reported to require high implant dosages up to the order of $10^{16}$ or $10^{17}$ $cm^{-2}$ and subjecting to extremely high annealing temperatures to acquire the nano-crystals formation. This contributes to device integration concerns, furthermore, ion implantation of high dosages amounts to long duration of manufacturing which affects the throughput of the fabrication process. The location of the implanted species can also be rather randomly distributed. In addition, the high annealing temperature of nano-crystals formation in $SiO_2$ is undesirable for the advance technological node as there is need to adopt annealing processes of low thermal budget.

In view of the above discussion, there is a need for an easy to integrate and implement technique for fabricating multiple-QD-based SET devices that have better stability against the Coulomb blockade effect as well as to site the implanted species at the designated and desired location of the device.

SUMMARY

Embodiments relate to a method for fabricating nano-wires in nano-devices, and more particularly to nano-device fabrication using end-of-range (EOR) defects.

In one embodiment, the method comprises providing a substrate with a surface crystalline layer over the substrate, creating end-of-range (EOR) defects in the surface crystalline layer, forming one or more fins with EOR defects embedded within and oxidizing the one or more fins to form one or more fully oxidized nano-wires with nano-crystals within the core of the nano-wire.

In another embodiment, the method comprises providing a substrate with a surface crystalline layer over the substrate, creating end-of-range (EOR) defects in the surface crystalline layer, forming one or more fins with EOR defects embedded within, oxidizing the one or more fins, removing the oxide from the one or more fins to form one or more nano-wires and oxidizing the one or more nano-wires to form one or more fully oxidized nano-wires with nano-crystals within the core of the nano-wire.

These and other objects, along with advantages and features of the present invention herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIGS. 2d-f show alternative embodiments of nano-wire arrangements;

DETAILED DESCRIPTION

Embodiments relate to nano-wires and methods of fabricating nano-wires. The nano-wires can be employed in nano-devices or structures. In one embodiment, the nano-wires are incorporated in a SET device. Such SET devices can be used to form ICs, such as voltage or charge state logics. The devices can be incorporated into consumer electronic products, such as single-electron spectroscopy, electrometers and memory, such as random access memory (RAM) devices.

Figure 1:
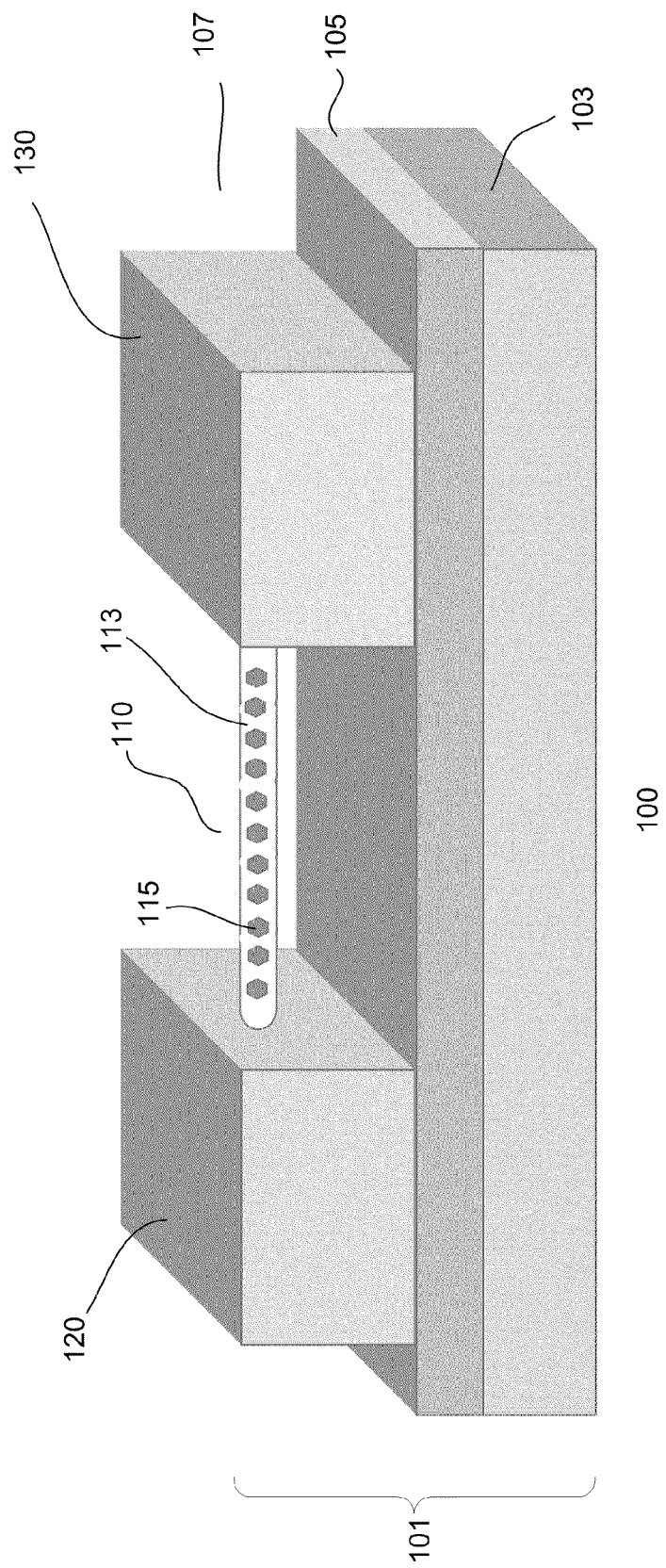
FIG. 1 shows an embodiment of a device with a nano-wire.

FIG. 1 shows an embodiment of a nano-structure 100. As shown, the nano-structure is formed on a substrate 101. In one embodiment, the substrate comprises a crystalline-on-insulator (COI) substrate. The substrate, for example, comprises a top or surface silicon layer 107 and a bulk silicon 103 with a buried oxide (BOX) 105 therebetween to form a silicon-on-insulator (SOI) substrate. Alternatively, other types of crystalline materials, such as silicon germanium may also be useful. The surface layer can be patterned to form first and second contact regions 120 and 130. The contact regions, for example, comprise doped regions formed on the surface silicon layer. In one embodiment, the doped regions can comprise first polarity type dopants. The first polarity type dopants, for example, are p-type dopants. Alternatively, n-type dopants are used to form the doped regions. Providing other types of contact regions may also be useful. The contact regions, for example, may serve as source and drain pads of a SET.

Connecting the contact regions is a nano-wire 110. In one embodiment, the nano-wire comprises an oxide support structure 113 containing nano-crystals or nano-clusters 115. For example, a few nano-crystals may be clustered together. The support structure of the nano-wire may have a cross-sectional size of, for example, about 20-30 nm in diameters. Forming support structures having other sizes may also be useful. The nano-crystals are uniformly distributed within the support structure. The nano-crystals may also have a uniform size of about 5-10 nm in diameter. In some instances, the term nano-crystals and nano-clusters may be used interchangeably. The nano-crystals may comprise a semiconductor material. The nano-crystals comprise, for example, silicon. Providing nano-crystals of other types of semiconductor materials may also be useful.

In one embodiment, the nano-crystals are derived from end-of-range (EOR) defects created from a pre-amorphization implant (PAI) process. The PAI process implants ions into a crystalline substrate or layer. For example, the PAI implants silicon ions ($Si^+$). Other types of ions, such as $Ge^+$, may also be useful. The PAI renders the crystalline material amorphous. EOR defects are located at the interface of the amorphous and crystalline materials. By selecting the appropriate implant energy, the EOR defect depth can be precisely controlled in the crystalline substrate or layer.

Figure 2A:
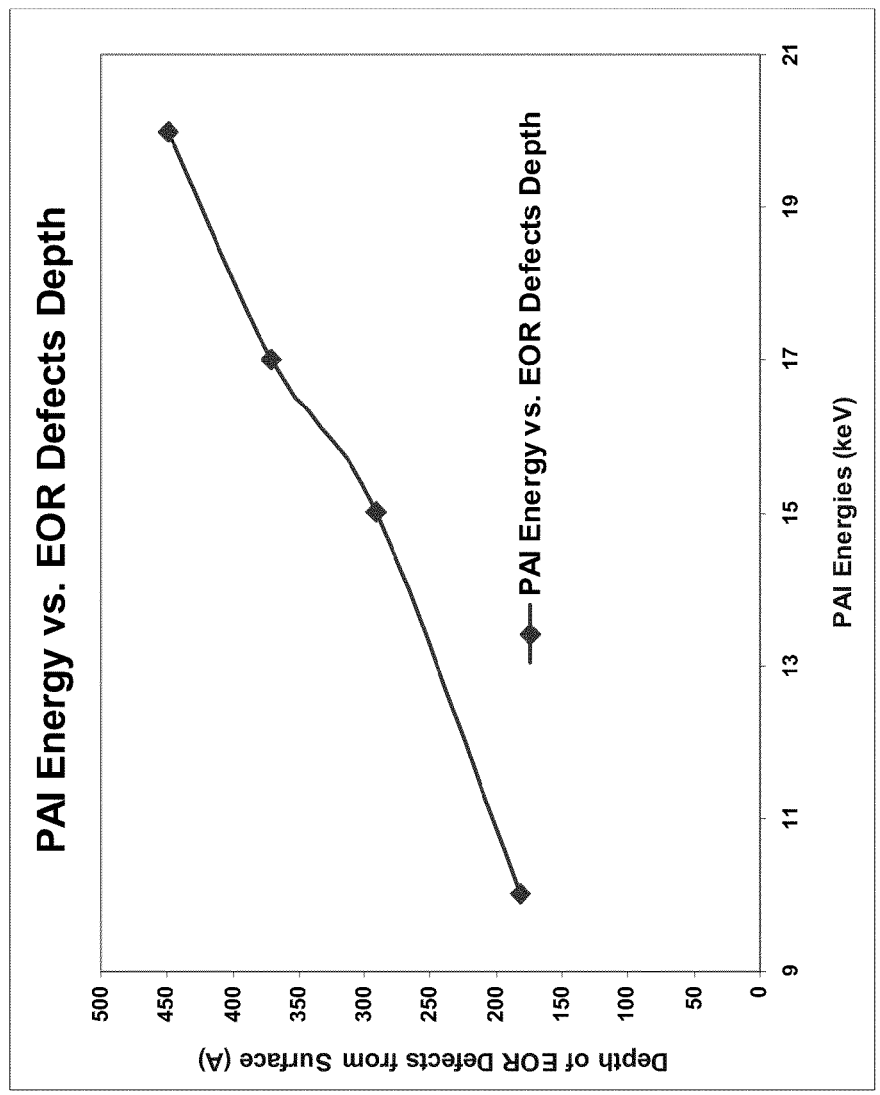
FIG. 2a shows a chart correlating depth of EOR defects vs. PAI energy.

FIG. 2a shows experimental results correlating PAI energy of $Si^+$ ions and depth of EOR. The experiment was conducted by implanting $Si^+$ ions in an SOI substrate in which the surface crystalline layer is about 5000 Å thick. The PAI dose is about $1 \times 10^{16}$ $cm^{-2}$. As indicated by the graph, depth of EOR defects increases with PAI energy. For example, the higher the PAI energy, the deeper the EOR defects are from the surface of the crystalline layer. By selecting the appropriate PAI energy, the EOR defects can be precisely located in a crystalline material. This enables nano-crystals to be formed with uniform size and distribution within the nano-wire.

The ability to uniformly distribute the nano-crystals with uniform size in the nano-wire ensures the proper function of the device as the spatial distance between nano-crystals should not be too far apart. In the event adjacent nano-crystals are too far apart, the device will fail to function as a charge cannot transmit through the insulating $SiO_2$. The charge transfer mechanism is by quantum mechanical tunneling. For example, when two quantum dots (nano-crystals) are in close proximity, the charge can tunnel (or penetrate) through the oxide separating the two nano-crystals by the application of a voltage. The flow and direction of flow can be controlled by, for example, applying the appropriate bias voltage between the contact regions.

As described, nano-crystals are derived from EOR defects. The use of EOR defects enables the nano-crystals to be precisely located at desired locations of a device. In one embodiment, the nano-crystals are formed from multiple oxidizing annealing processes. Alternatively, the nano-crystals are formed using a single oxidizing annealing process. Furthermore, implant dosages and annealing conditions to form the nano-crystals in an oxide support structure are lower than those required to form conventional silicon nano-wires.

Figure 2B:
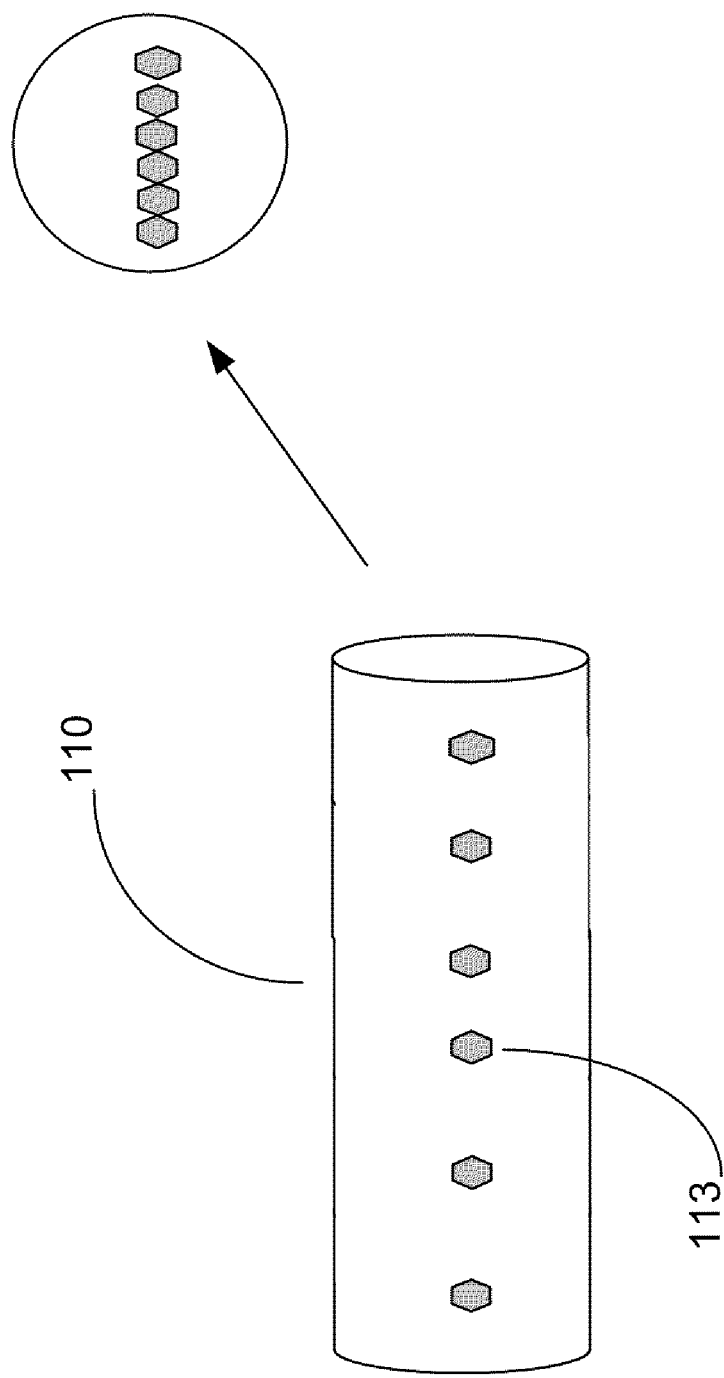
FIGS. 2b-c show side and cross-sectional views of various embodiments of nano-wires.
Figure 2C:
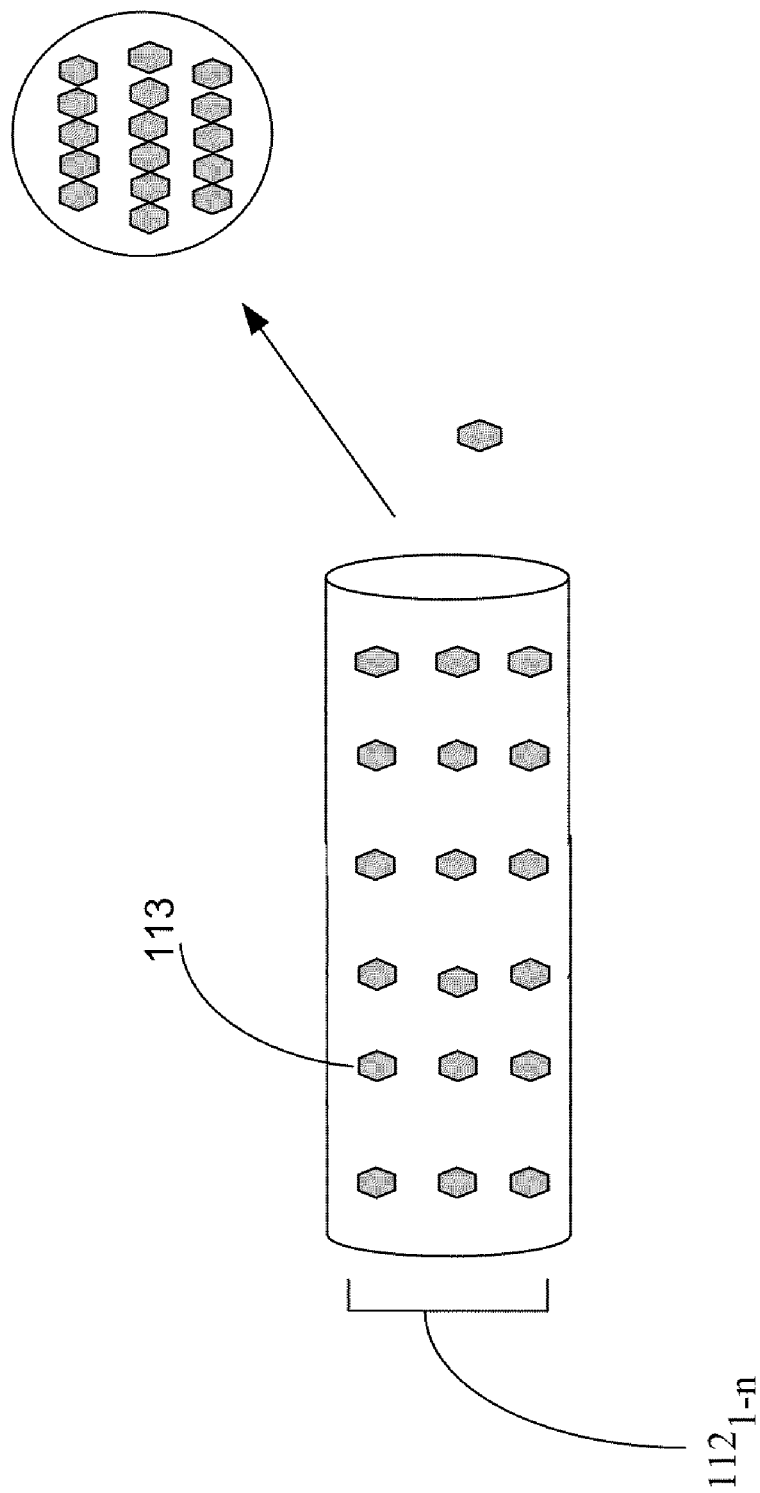

FIGS. 2b-c show side and cross-sectional views of various embodiments of nano-wires. Referring to FIG. 2b, a nano-wire 110 is shown. Nano-crystals 113 are distributed in a single row within the nano-wire. As shown in the cross section, the row of nano-crystals may include a plurality of nano-crystals or nano-crystal clusters. Providing a row of single crystals or a combination of single nano-crystals and nano-crystal clusters may also be useful.

In FIG. 2c, nano-crystals 113 are distributed in multiple rows $112_{1-n}$, wherein n is a whole number. The nano-crystals are, for example, distributed in 3 rows. The nano-crystals may also be distributed in other number of rows. The number of rows may depend on, for example, the size of the support structure and nano-crystals. As shown in the cross section, the row of nano-crystals may include a plurality of nano-crystals or nano-crystal clusters. Providing a row of single crystals or a combination of single nano-crystals and nano-crystal clusters may also be useful.

Figure 2D:
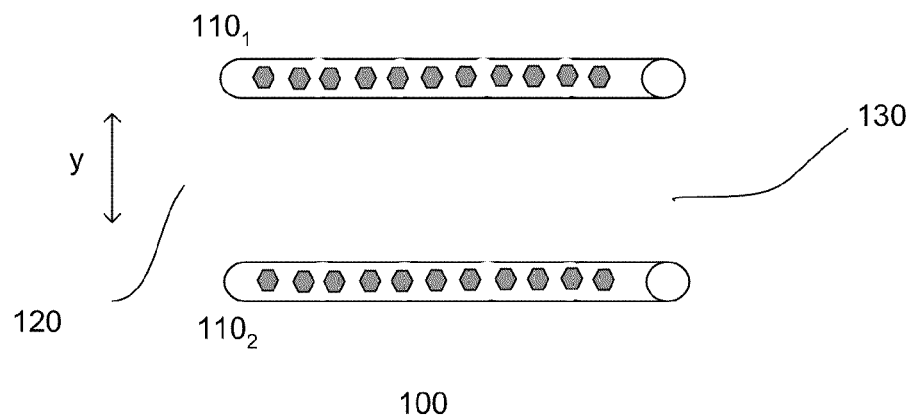
Figure 2E:
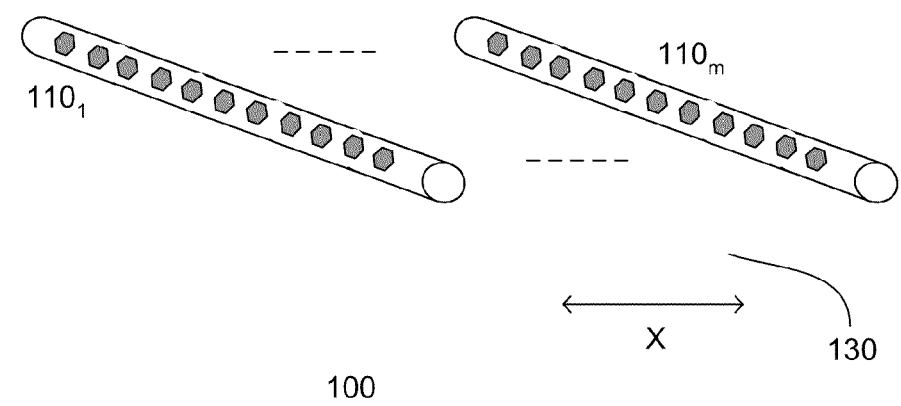

As shown in FIG. 1, a single nano-wire is coupled between the first and second contact regions. In other embodiments, multiple nano-wires can be provided to increase current flow between the contact regions. For example, first and second nano-wires $110_1$ and $110_2$, can be arranged in a column in the y direction between first and second contact regions 120 and 130, as shown in FIG. 2d. The first and second nano-wires form, for example, a twin nano-wire arrangement. Providing more than two nano-wires in the column direction may also be useful. Alternatively, a plurality of nano-wires $110_{1-m}$, where $m \geq 2$, are arranged in a row in the x direction between first and second contact regions 120 and 130, as shown in FIG. 2e. In yet other embodiments, multiple nano-wires may be provided in both column and row directions. For example, as shown in FIG. 2f, the multiple nano-wires may be arranged as a 2×3 matrix of nano-wires. Arranging the multiple nano-wires in other size matrices may also be useful. In one embodiment, the multiple nano-wires are arranged in a 2×m matrix.

Figure 3A:
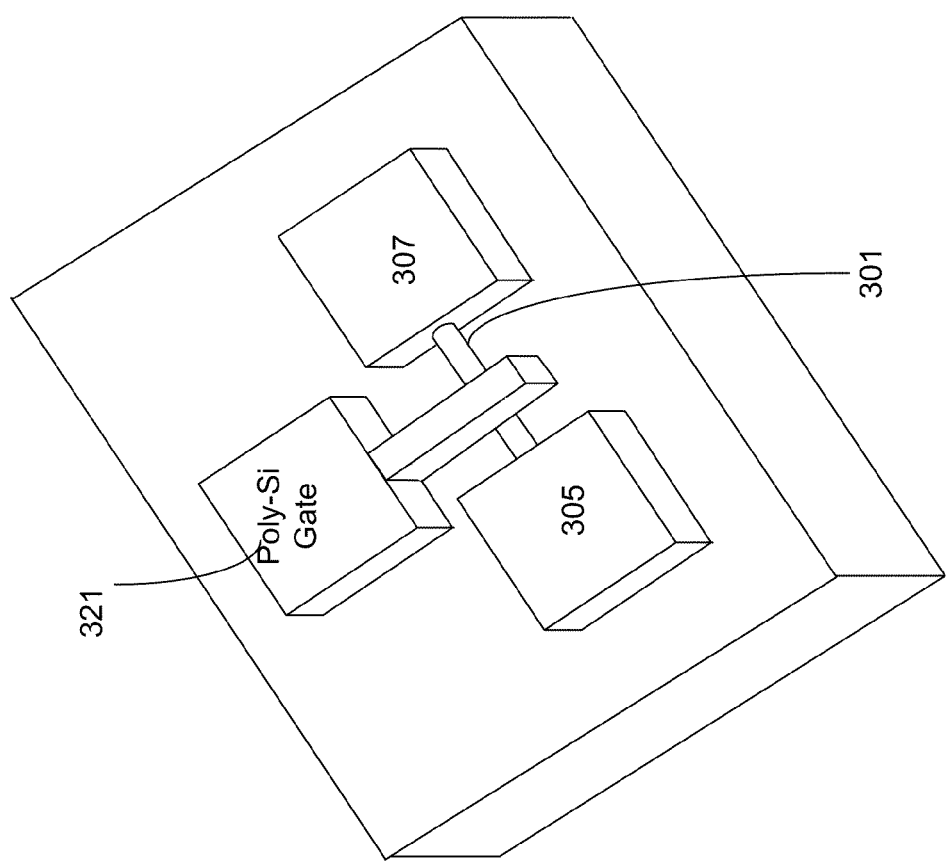
FIGS. 3a-d show plan and side views of embodiments of devices incorporating nano-wires.
Figure 3B:
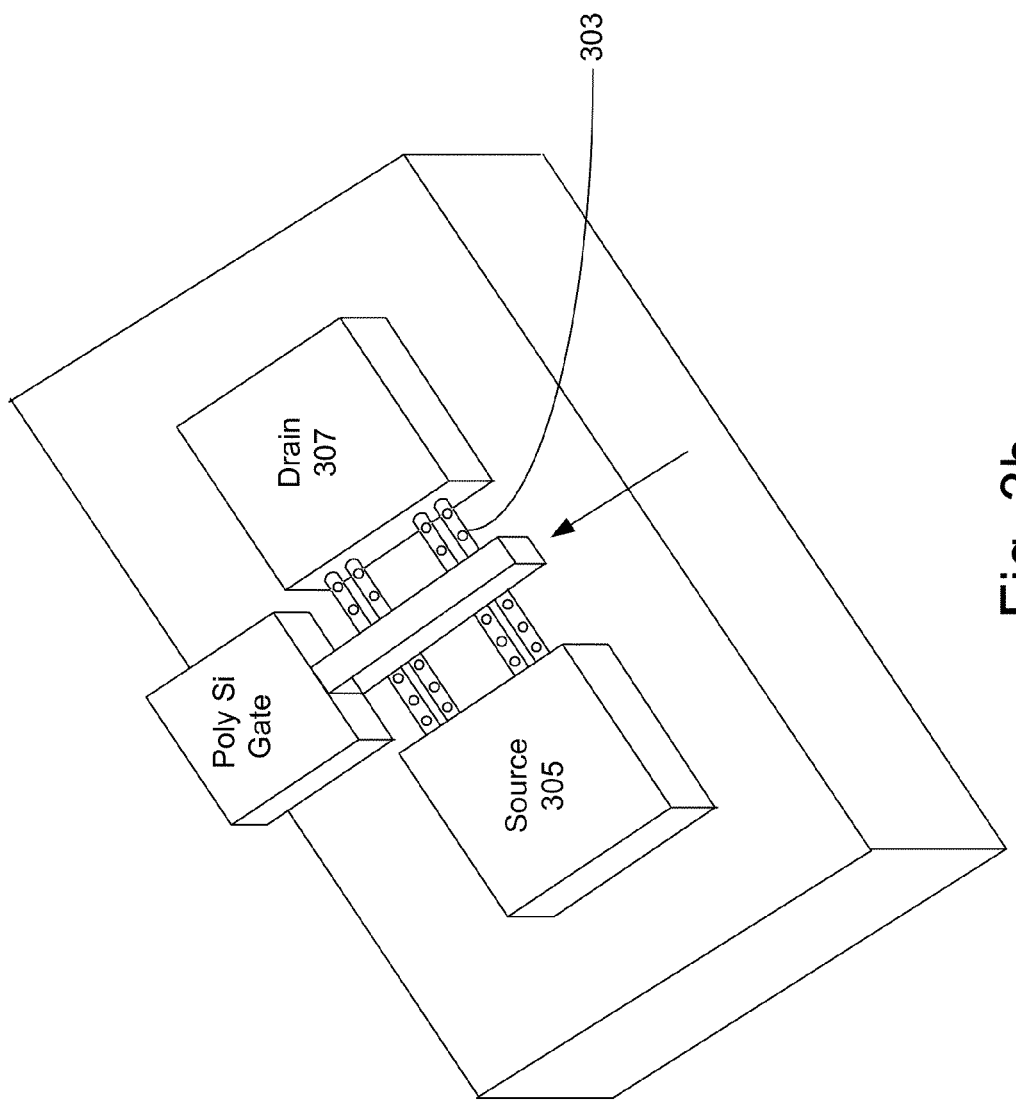
Figure 3C:
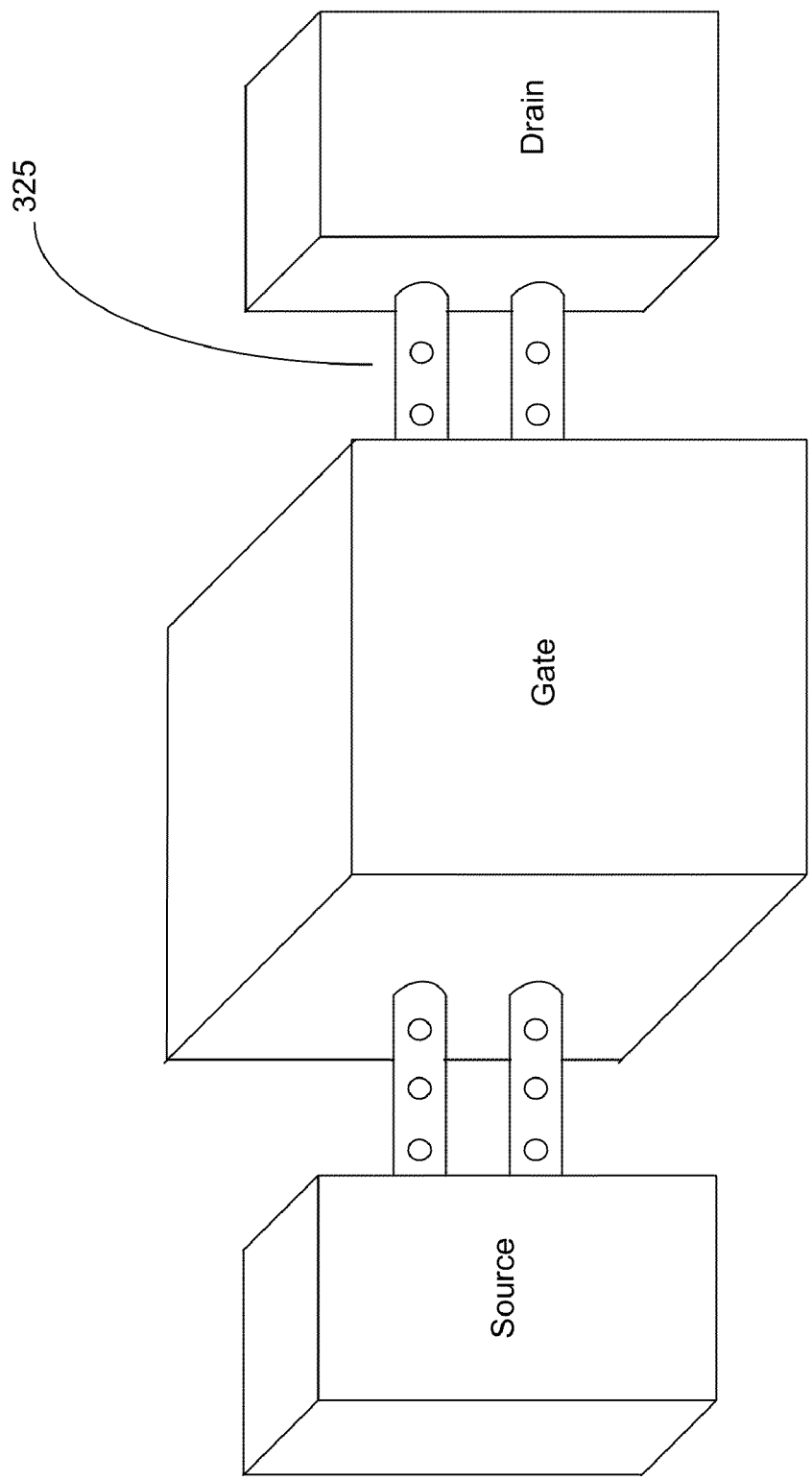

FIG. 3a shows plan and side views of a device incorporating a nano-wire 301. As shown, the device comprises a transistor having a Poly-Si gate 321 formed between the source pad 305 and drain pad 307 over the nano-wire structure 301. FIG. 3b is similar to FIG. 3a, but as shown, instead of having only one nano-wire, the device has multiple nano-wires 303 arranged in, for example, a row. FIG. 3c shows plan and side views of an alternative embodiment with multiple nano-wires 325 arranged in, for example, a column between the drain and source pads. As shown, the column includes twin nano-wires. Providing other number of nano-wires in a column may also be useful.

Figure 3D:
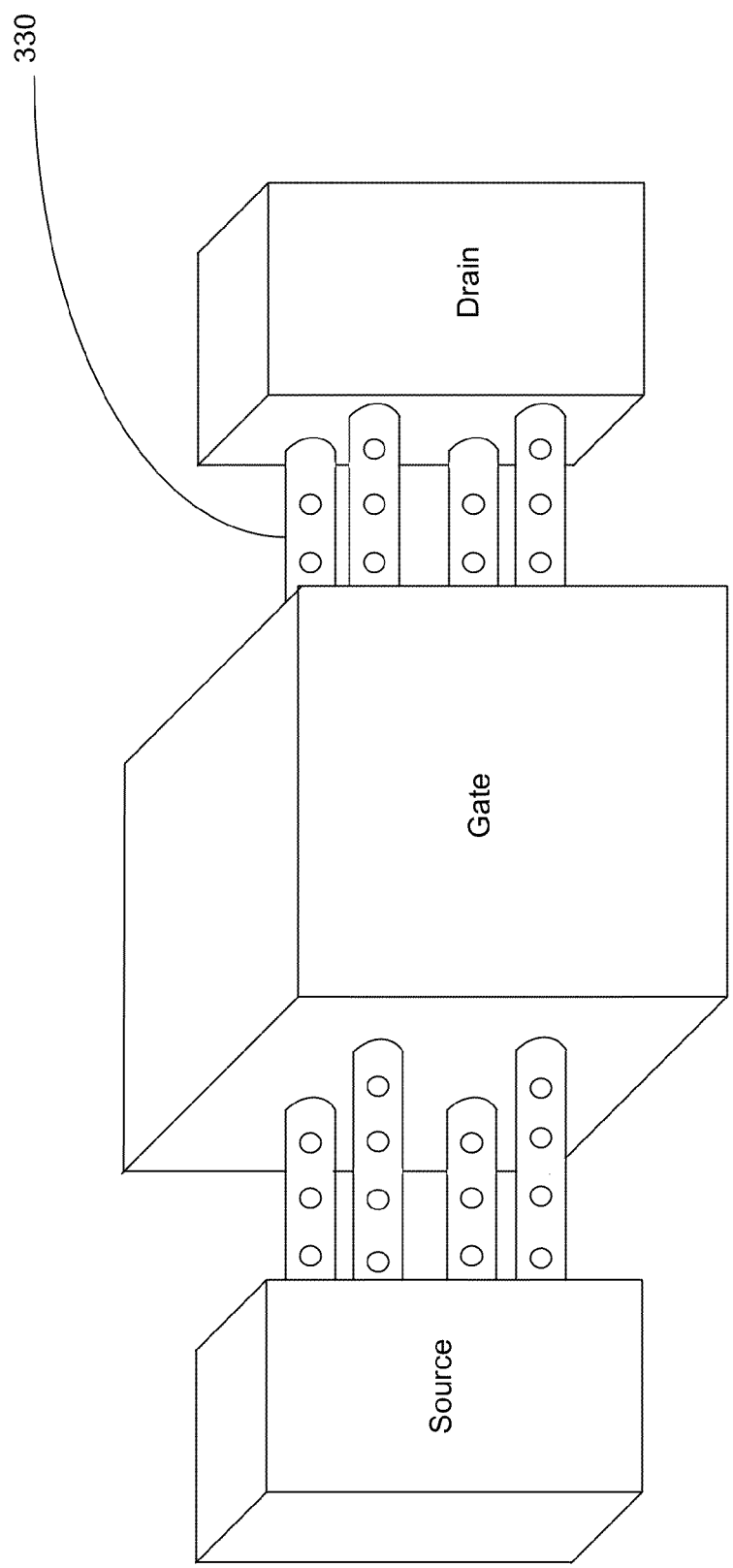

In yet other embodiments, multiple rows and columns of nano-wires 330, as shown in FIG. 3d, may also be utilized. For example, the multiple nano-wires may be arranged in a 2×2 matrix of nano-wires. Arranging the multiple nano-wires in other size matrices may also be useful. For example, the multiple nano-wires may be arranged in a 2×m matrix. Increasing the number of nano-wires, such as having multiple rows and/or columns of nano-wires, increases the net effective drive current as well as improves device reliability.

Figure 4A:
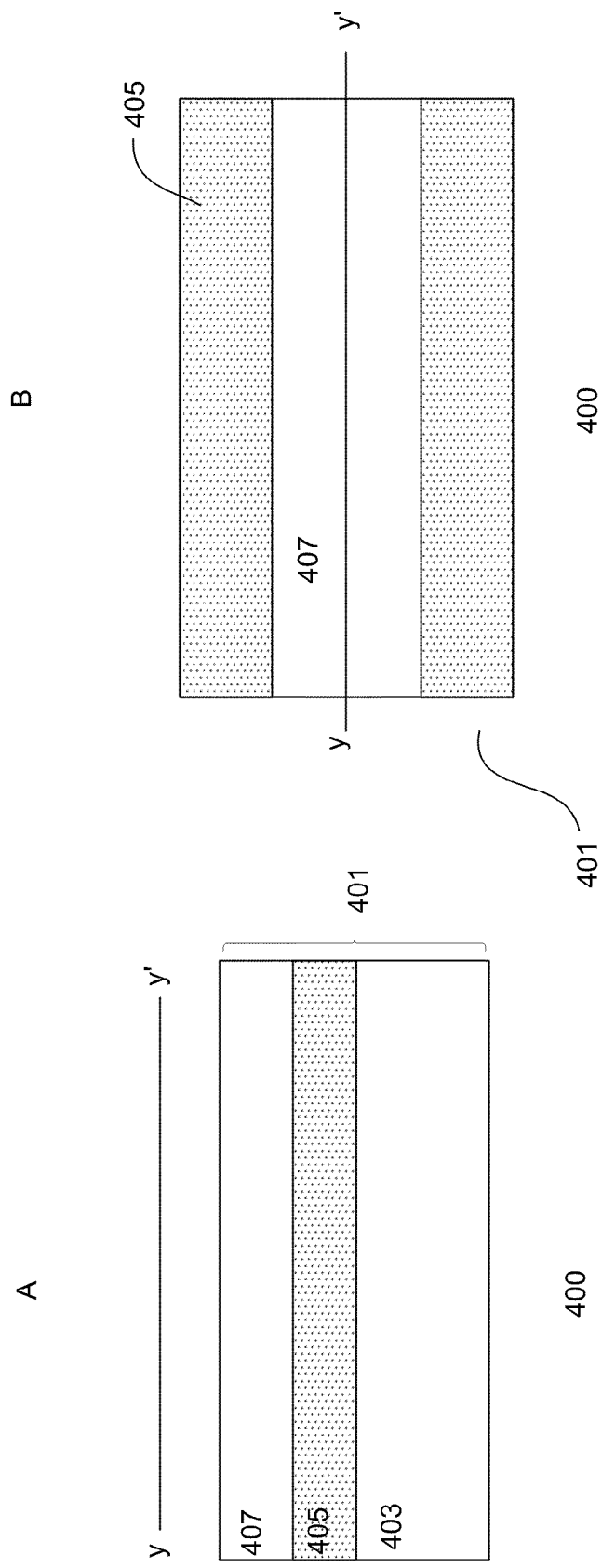
FIGS. 4a-i show cross-sectional and plan views of a process for forming a device with a nano-wire.

FIGS. 4a-g show cross-sectional (A) and plan (B) views of an embodiment of a process 400 for forming a nano-wire. The cross-sectional view is taken along the axis y-y'. Referring to FIG. 4a, a substrate 401 is provided. The substrate, in one embodiment, comprises a COI substrate. A COI substrate includes a bulk crystalline layer 403 and a surface crystalline layer 407 separated by an insulating layer 405, referred to as a BOX. The bulk crystalline and surface crystalline layers may comprise silicon (Si) to form a SOI substrate. Other types of crystalline materials, such as silicon germanium or germanium may also be useful.

Figure 4B:
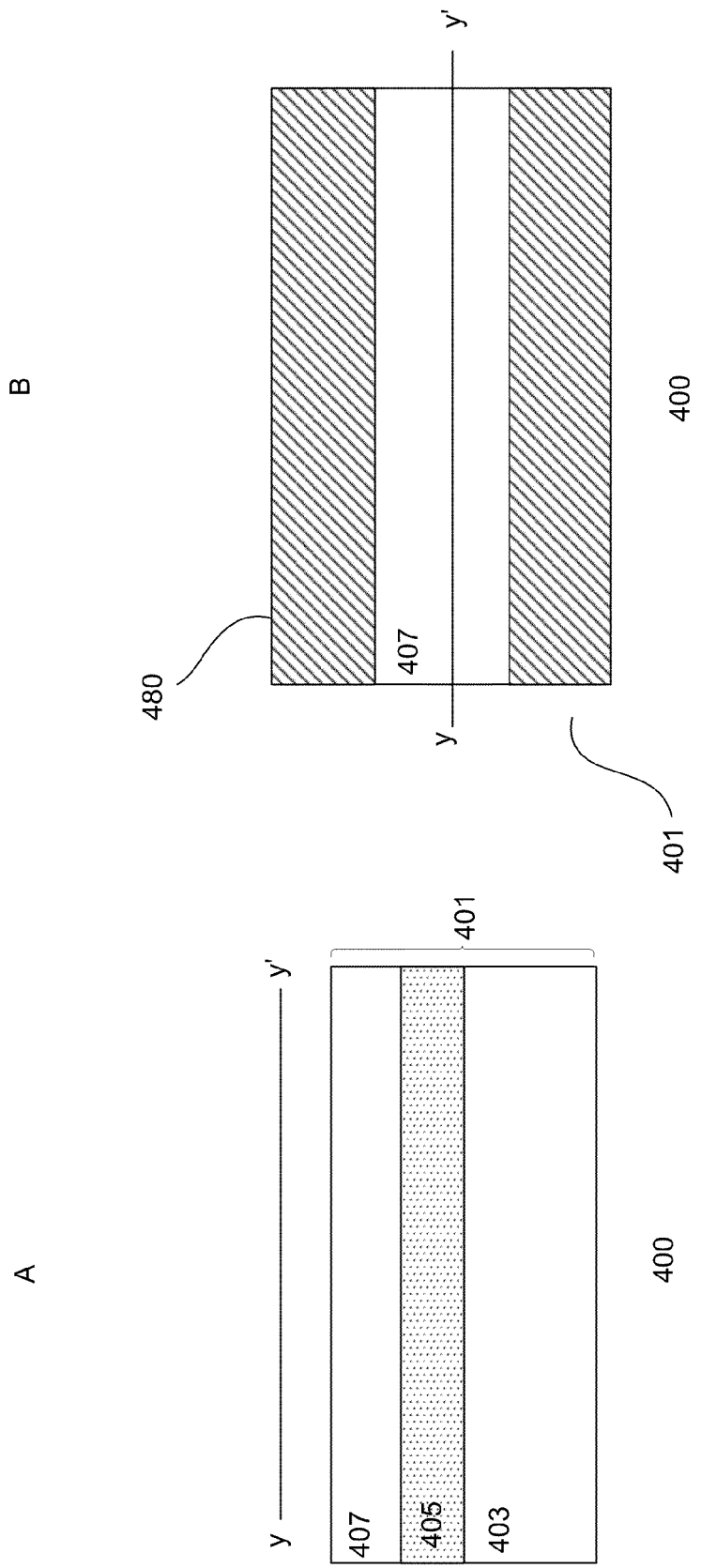

In FIG. 4b, a soft mask layer 480 is formed on the substrate surface. In one embodiment, the soft mask comprises photoresist. The soft mask may be formed by spin on techniques. The soft mask is patterned to create an opening for selectively processing the substrate. Patterning the soft mask can be achieved by selectively exposing it to an exposure source with a photomask containing the desired pattern. The soft mask is developed after exposure, transferring the pattern of the photomask to the soft mask.

To improve lithographic resolution, an anti-reflective coating (ARC) layer (not shown) may be provided below the soft mask. The ARC, for example, may be an organic or inorganic ARC. Other types of ARC materials may also be useful. Various techniques, such as CVD or spin on, may be employed to form the ARC. The portion of the ARC exposed by the patterned soft mask may be removed by, for example, an anisotropic etch such as reactive ion etch (RIE).

Figure 4C:
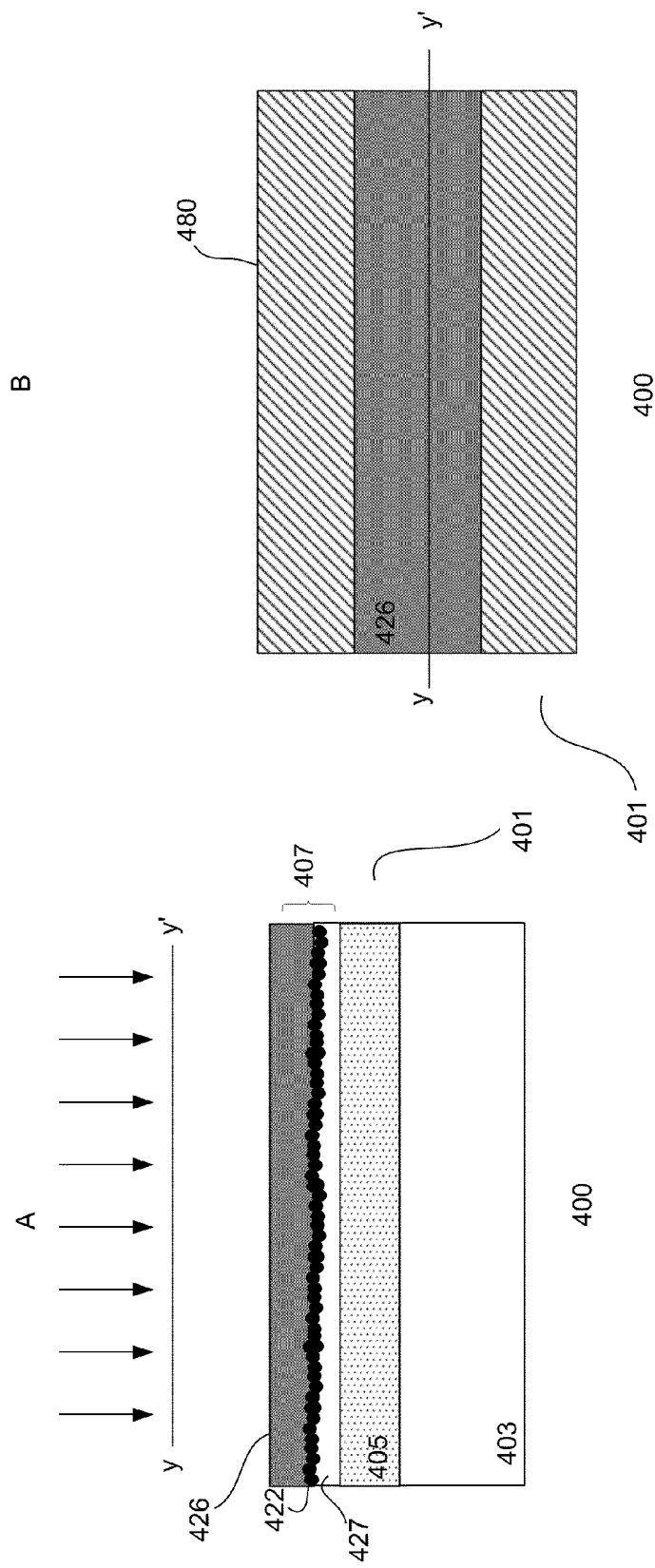

In one embodiment, as shown in FIG. 4c, the substrate is processed to create end-of-range (EOR) defects 422 in the surface crystalline layer. In one embodiment, the EOR defects are created by a pre-amorphization implant (PAI). The PAI transforms an upper or surface portion 426 of the surface crystalline layer to an amorphous ($\alpha$) layer. For example, the PAI transforms the surface crystalline Si layer to an $\alpha$-Si layer. A lower portion 427 of the surface crystalline layer below the EOR defects remains crystalline in structure.

The PAI may implant various types of ions into the substrate. For example, the PAI may implant $Si^+$ or $Ge^+$ ions into the surface crystalline layer. Implanting other types of ions or a combination of different types of ions may also be useful. The parameters of the PAI may be tailored to produce EOR defects at the desired depth in the surface crystalline layer. In one embodiment, the location of the EOR defects corresponds to the location of the nano-crystals of the nano-wire to be formed.

In one embodiment, the dose of the implant should be sufficient to form nano-crystals with the desired distribution in the nano-wire. The implant dose corresponds to the EOR defect density. For example, the higher the dose, the higher the EOR defect density. In one embodiment, the dose should be sufficiently high to form high EOR defect density as a high EOR defect density may be desirable. For example, some EOR defects may dissolve due to various thermal processes of the fabrication process. By having a high EOR defect density, this may ensure the formation of nano-crystals having the desired distribution in spite of loss of EOR defects during processing. In one embodiment, the PAI dose is from $1 \times 10^{15}$ $cm^{-2}$ to $1 \times 10^{17}$ $cm^{-2}$. The PAI energy determines the depth of EOR defects. In one embodiment, the PAI dose and energy are selected to avoid fully amorphizing the crystalline layer. In one embodiment, the PAI dose and energy are selected to avoid fully amorphizing the surface crystalline layer of the COI substrate.

Figure 4D:
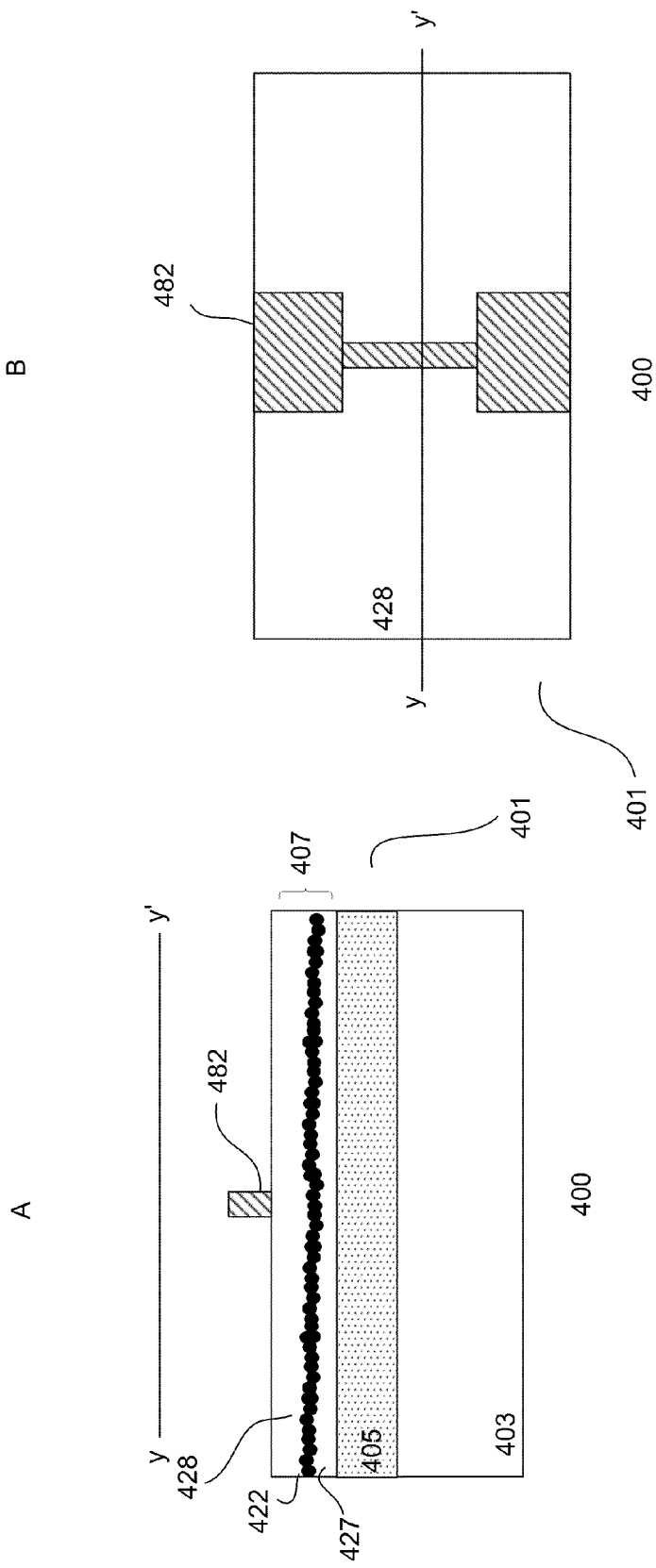

Referring to FIG. 4d, the soft mask 480 may be removed. After removal, the substrate is subjected to an anneal to recrystallize the $\alpha$-Si layer to form a crystalline layer 428. The anneal, for example, comprises a rapid thermal annealing (RTA). Other annealing process, for example, spike annealing, laser annealing or flash annealing may also be used. The anneal should have a sufficiently low thermal budget to reduce or avoid excessive dissolution of EOR defects. The anneal also stabilizes the defects which reduces their susceptibility to dissolution by further thermal processes. In one embodiment, the anneal comprises a low temperature RTA. Performing an anneal while maintaining a sufficiently low thermal budget using other parameters may also be useful.

Figure 4E:
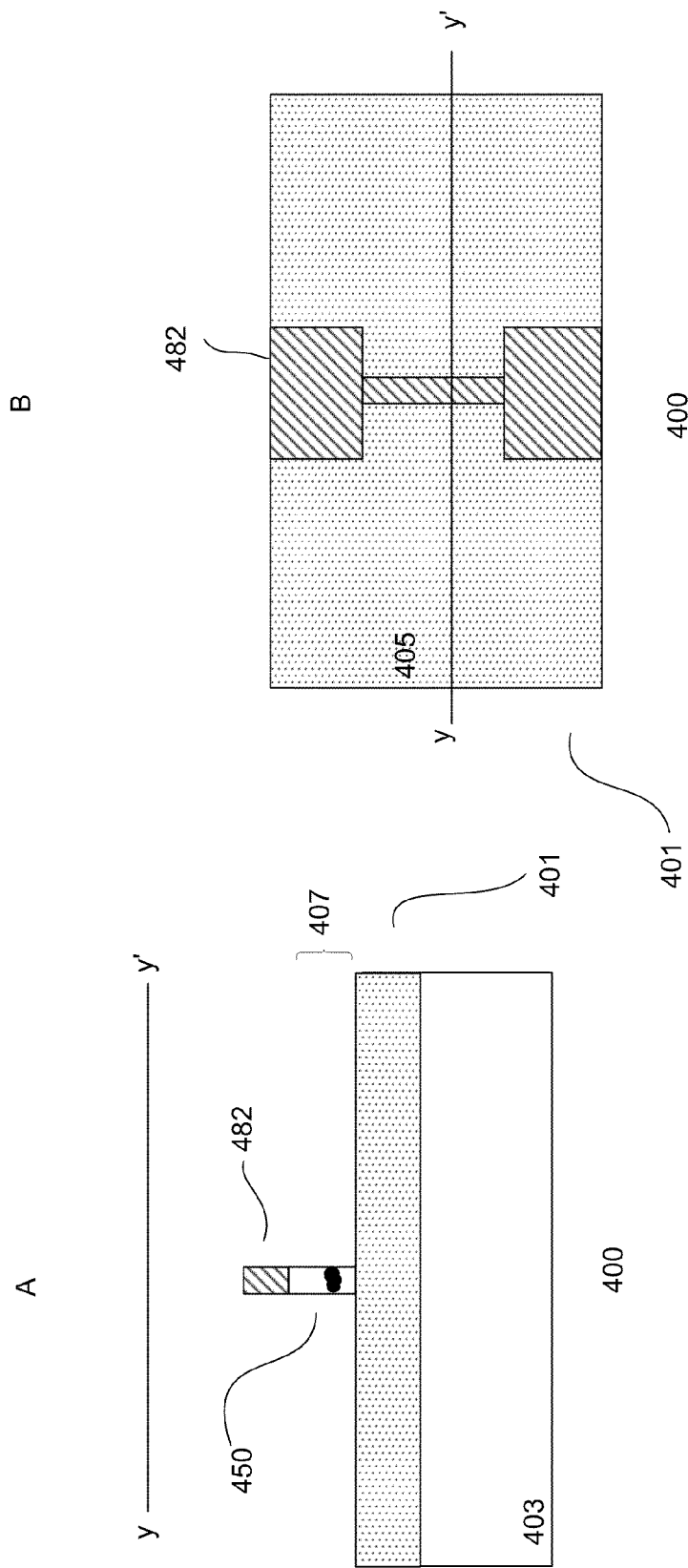

A mask 482 is formed over the substrate. The mask may comprise a hard mask layer which can be a silicon oxide or silicon nitride layer. Other types of hard mask materials or masks may also be useful. For example, the mask may comprise photoresist. The hard mask may facilitate a more conformal sidewall etching. The mask is patterned to selectively expose portions of the substrate to be removed. In one embodiment, the mask is patterned to expose portions of the surface crystalline layer having EOR defects to be removed. The exposed portions are removed, as shown in FIG. 4e. Removal of the exposed portions can be achieved by, for example, an anisotropic etch, such as RIE. The etch forms a fin or post 450 having EOR defects. In one embodiment, the etch forms a fin or post connected to first and second pad regions 420 and 430. The width of the fin or post may be about 20-30 nm. Forming fins of other dimensions may also be useful.

Figure 4F:
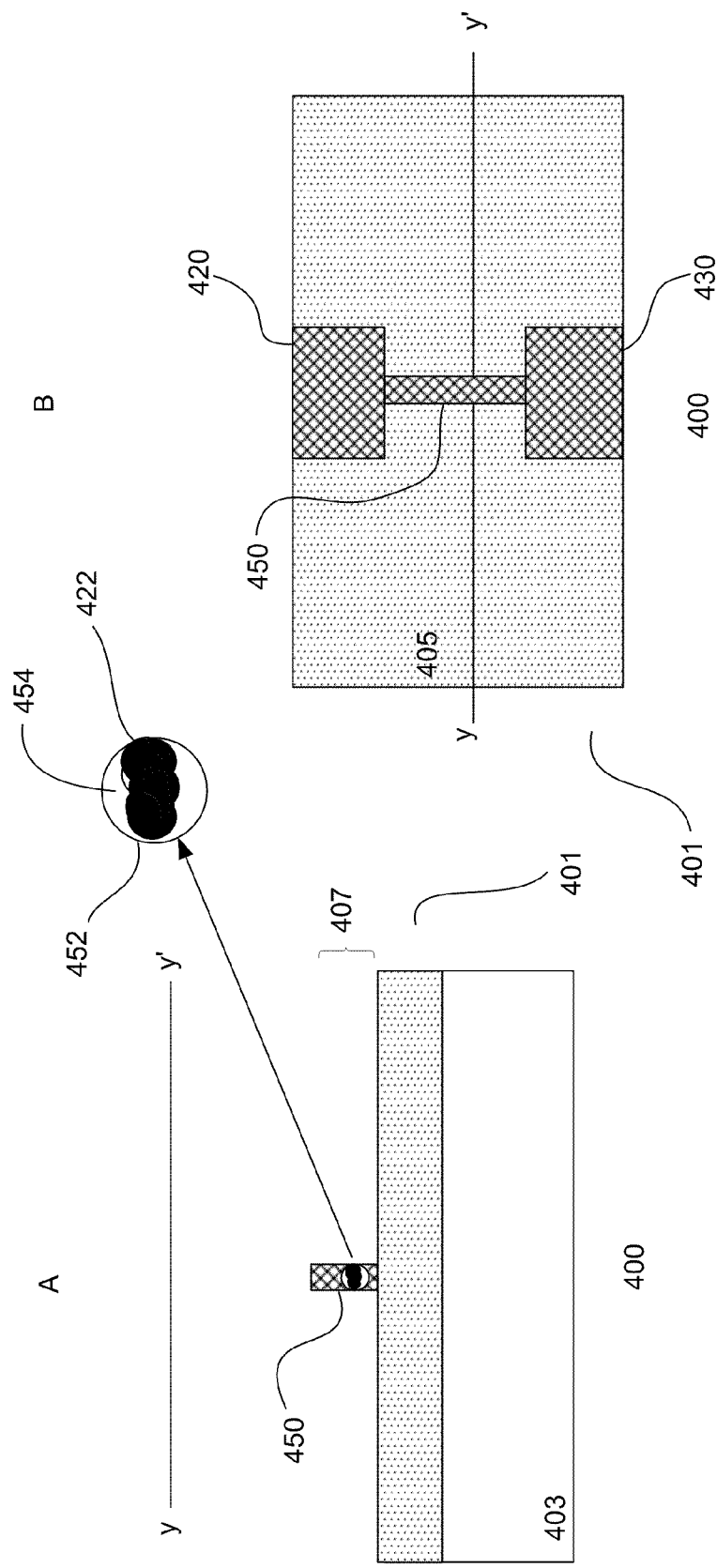

As shown in FIG. 4f, the fin or post 450 is oxidized. The fin is oxidized after removal of the hard mask layer. Oxidizing the fin, in one embodiment, forms a crystalline nano-wire core 452. In another example, oxidizing the fin forms a silicon nano-wire core. The nano-wire core, for example, comprises crystalline material 454 surrounding EOR defects 422. Oxidizing the fin is achieved by subjecting the substrate to an anneal in an oxidizing ambient. In one embodiment, a furnace anneal is employed. Other types of anneals may also be useful. In one embodiment, the anneal is performed at a temperature of about 1100° C. for about 5 hours in an oxidizing ambient. Forming the nano-wire core may also form a thin oxide layer in other parts of the crystalline layer exposed by the removal of the mask, for example, the pad regions.

In one embodiment, the oxide is removed selective to the crystalline material. For example, the oxide surrounding the nano-wire core and on the surface of the crystalline material of the substrate is removed. The oxide is removed by, for example, an etch. The etch, in one embodiment, comprises a wet etch. Other types of etch which can selectively remove the oxide surrounding the nano-wire core and on the surface of the crystalline substrate may also be useful.

Figure 4G:
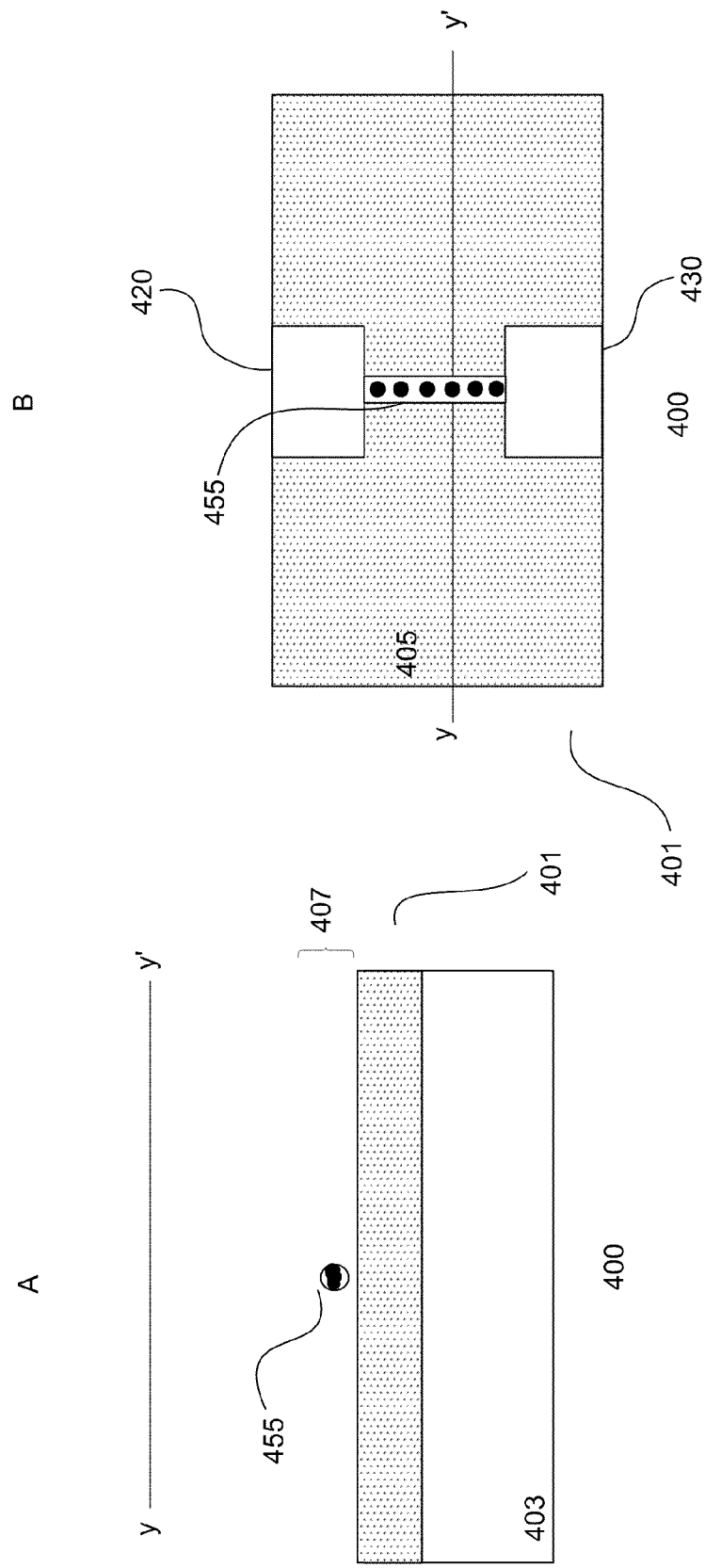
Figure 4H:
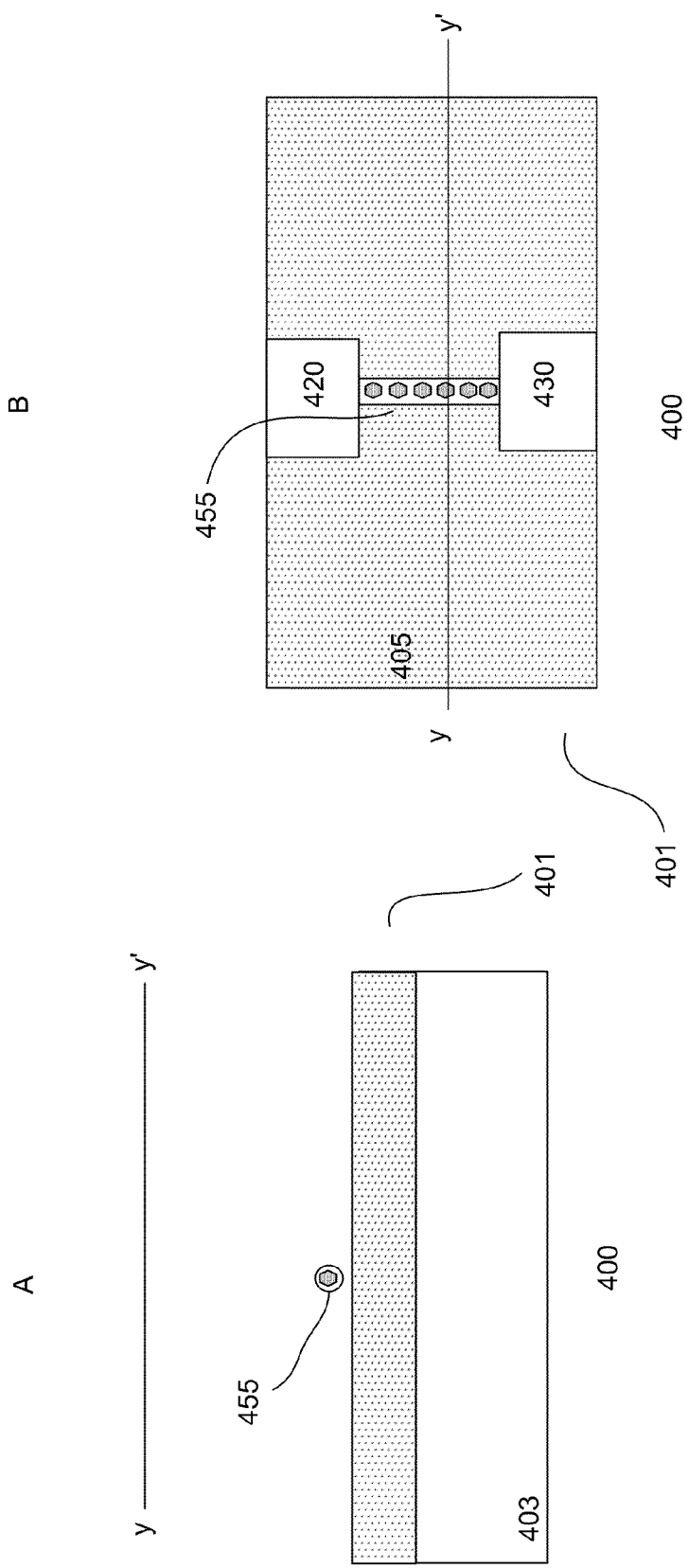

Removing the oxidized portions of the post or fin forms a nano-wire 455 coupled with the remaining portions of the surface crystalline layer 407, as shown in FIG. 4g. For example, the nano-wire is coupled to the pad regions. The substrate, in one embodiment, is annealed to transform the EOR defects into nano-crystals or clusters, as shown in FIG. 4h. For example, the anneal oxidizes the silicon nano-wire core to form a support structure and crystallizes the EOR defects to form nano-crystals in the support structure. In one embodiment, the anneal comprises an anneal in an oxidizing ambient. Other types of anneal or annealing process parameters may also be useful. The anneal may also form a thin oxide film on the surface and sides of the pad regions. The thin oxide film may be removed by, for example, a fast dip in diluted HF solution. Other techniques for removing the thin oxide film may also be useful.

The process continues, for example, to form a SET. The pad regions, for example, serve as source/drain regions of a transistor coupled by the nano-wire. The contact pads are coupled by the nano-wire.

Figure 4I:
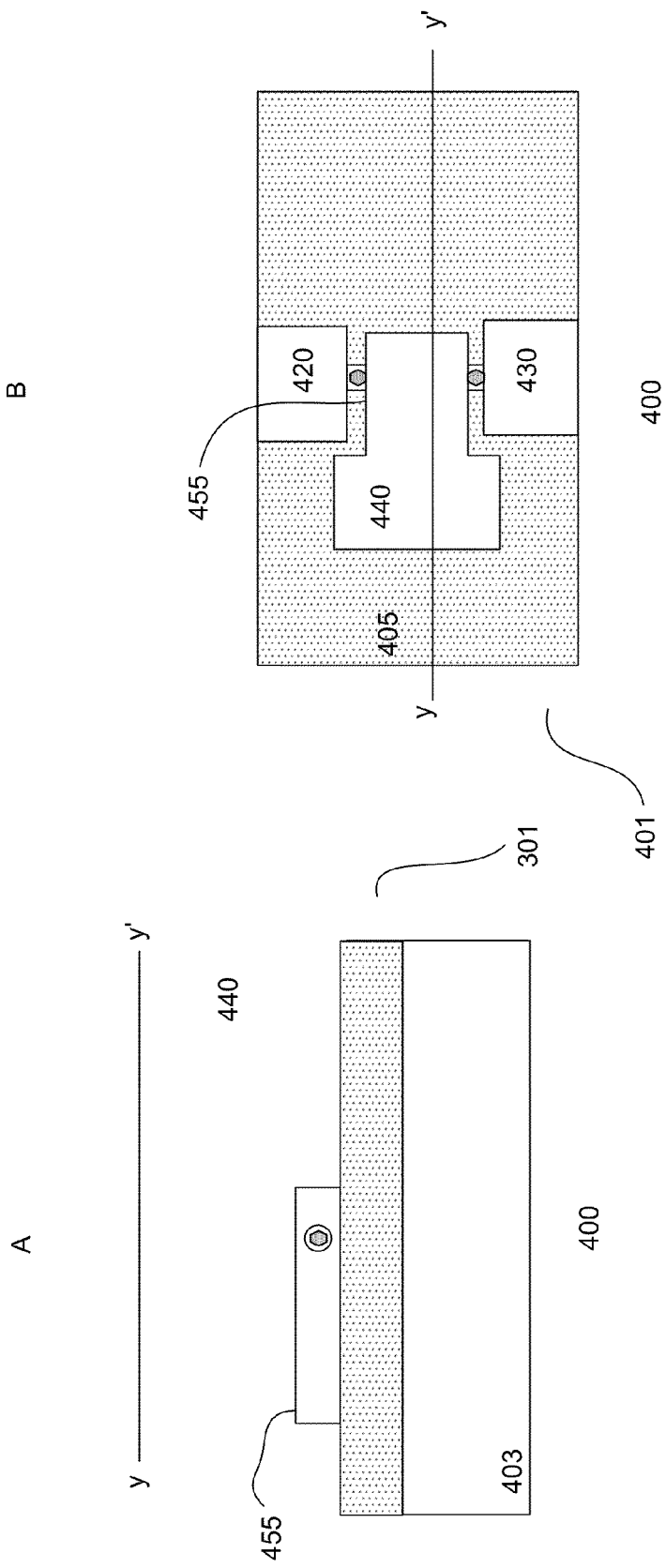

In FIG. 4i, a gate layer is deposited on the substrate. The gate layer, for example, comprises polysilicon. Other types of gate material, such as a metal gate, may also be useful. The gate layer, for example, can be formed by chemical vapor deposition (CVD). Other techniques may also be useful. The gate layer, for example is about 1300 Å. The gate layer is patterned to form a gate 440. The gate, as shown, comprises a T-shaped gate. Providing a gate with other shapes may also be useful. Patterning of the gate may be achieved using, for example, an anisotropic etch such as a RIE selective to oxide. The gate is separated from the source/drain regions and covers the nano-wire.

In one embodiment, the pad regions are doped with dopants of a first polarity type to form source/drain regions of the SET. The first polarity type may comprise a p-type for a PMOS SET or an n-type for a NMOS SET. For example, p-type dopants may comprise boron (B) while n-type dopants may comprise phosphorus (P) and/or arsenic (As). The contact pads may be doped after the gate has been patterned. Doping the contact pads at other stage of processing may also be useful. Selectively doping the contact pads may be achieved using, for example, an implant mask. The doping of the pads and gate is compatible to current CMOS processes.

As described, a single PAI process is performed to form a single row of nano-crystals or clusters in a nano-wire, as illustrated in FIG. 2b. In other embodiments, a nano-wire may be formed with a plurality of rows of nano-crystals or clusters, as illustrated in FIG. 2c. To form multiple rows of nano-crystals, a plurality of PAI processes are performed. For example, for n number of rows of nano-crystals or clusters, n number of PAI processes is performed. The different PAI processes are performed with different PAI energy to place the EOR defects in various depths with respect to, for example, the top surface of the crystalline layer. The various depths should be proximately close to form a nano-wire with multiple rows of nano-crystals or clusters. For example, each row should be separated by about a few angstroms to a few nanometers. Separating the rows of nano-crystals by other distances is also useful. In one embodiment, after each PAI process, an anneal is performed to recrystallize amorphous material and to stabilize the EOR defects.

Figure 5A:
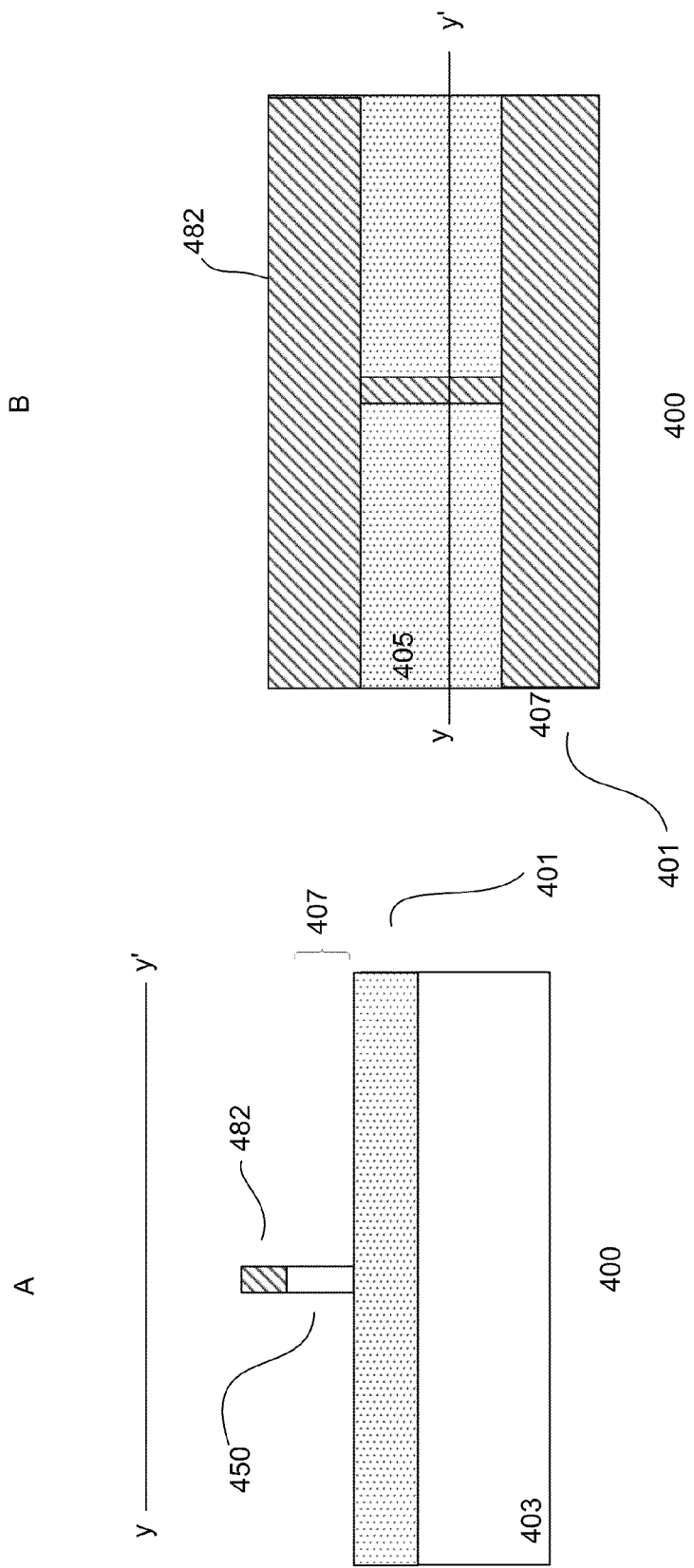
FIGS. 5a-b show cross-sectional and plan views of an alternative process for forming a device with a nano-wire.
Figure 5B:
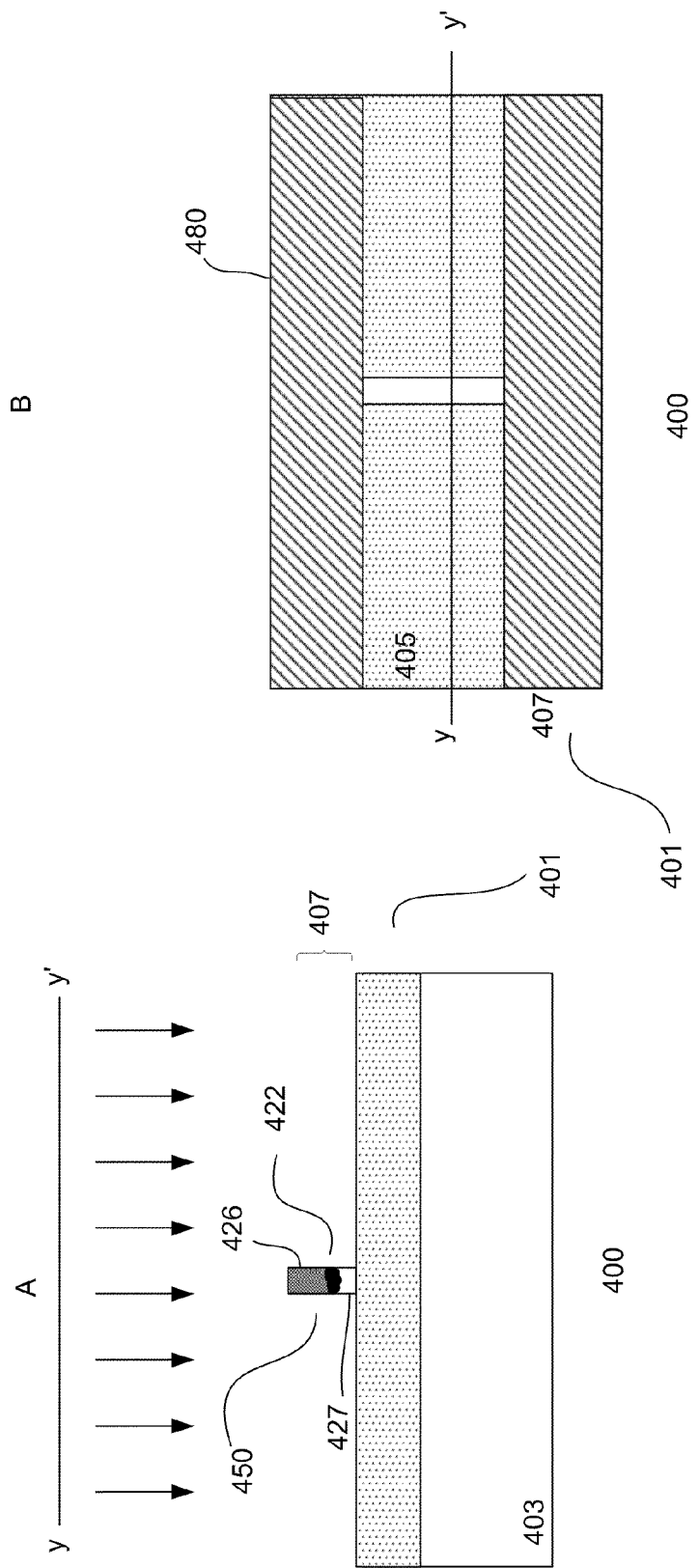

In an alternative embodiment, as shown in FIGS. 5a-b, the substrate may be patterned to form a fin 450 using a mask 482 prior to performing a PAI using a soft or implant mask 480 to form EOR defects 422. The process continues in a similar manner as described in FIGS. 4d-i, except for the patterning to form the post.

Figure 6A:
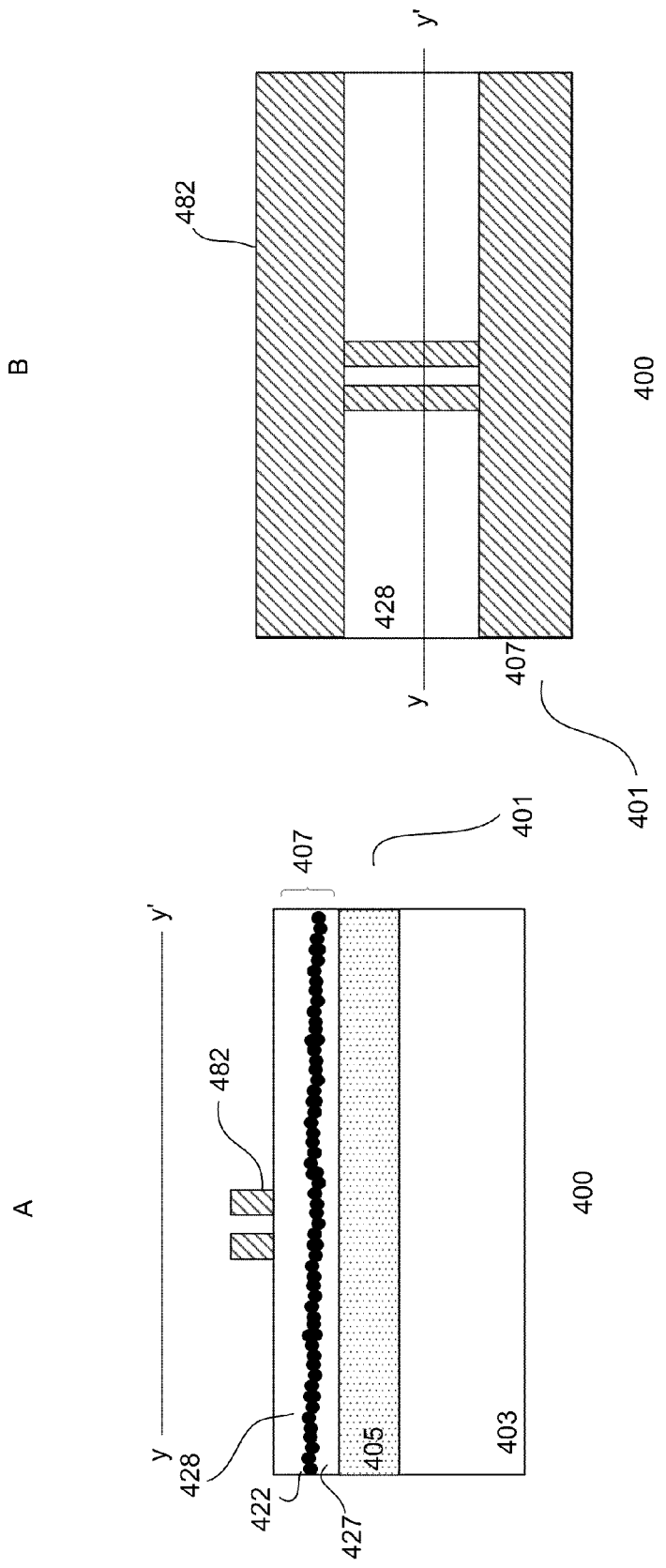
FIGS. 6a-c show cross-sectional and plan views of an alternative process for forming a device with nano-wires.
Figure 6B:
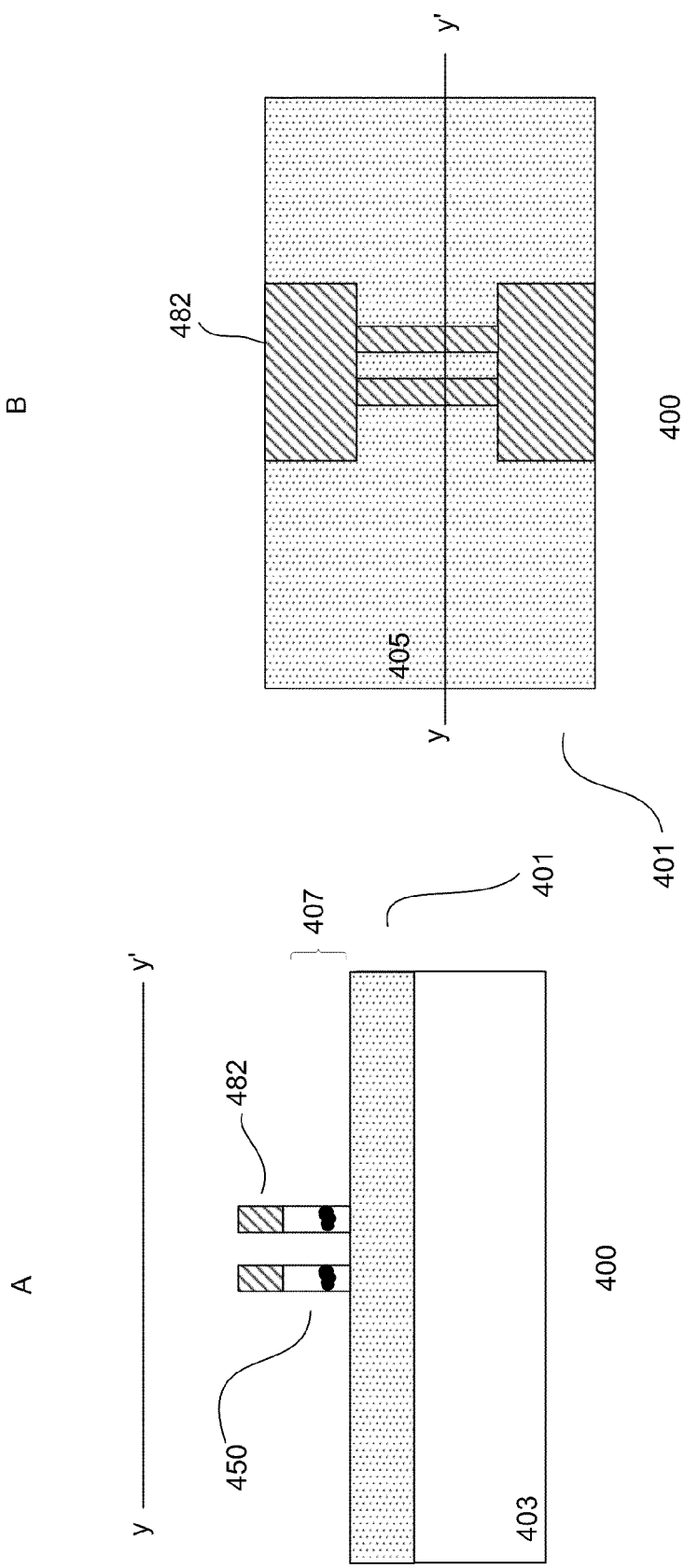
Figure 6C:
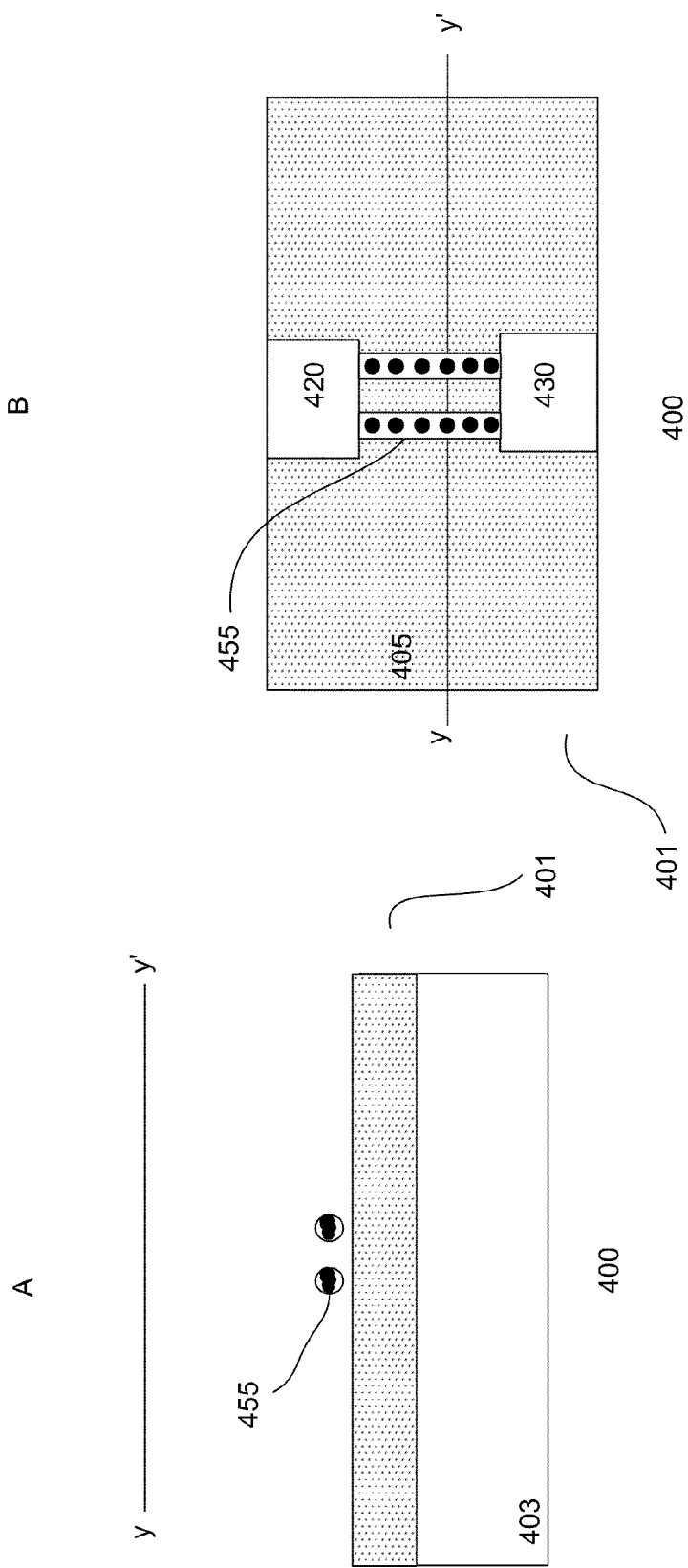

FIGS. 6a-c show cross-sectional (A) and plan (B) views of an embodiment of a process 400 for forming multiple nano-wires. As shown, a substrate 401 is at the stage of processing similar to that described in FIG. 4d. For example, the surface crystalline layer 407 includes EOR defects 422. A mask 482 is formed over the surface crystalline layer and patterned to selectively expose portions for removal.

Referring to FIG. 6b, an anisotropic etch, such as an RIE is performed to remove exposed portions of the surface crystalline layer, leaving a plurality of posts $450_{1-m}$. As shown, two posts $450_{1-2}$ remain after the RIE. The process continues in a similar manner as described in FIGS. 4f-h to produce first and second nano-wires $455_{1-2}$ coupled to first and second contact regions 420 and 430, as shown in FIG. 6c. The nano-wires are arranged in a row format. The process then continues in a similar manner as described in FIG. 4i to form a SET having a row of two nano-wires. In other embodiments, m number of nano-wires may be arranged in a row by forming m number of posts or fins between the first and second contact regions.

Figure 7A:
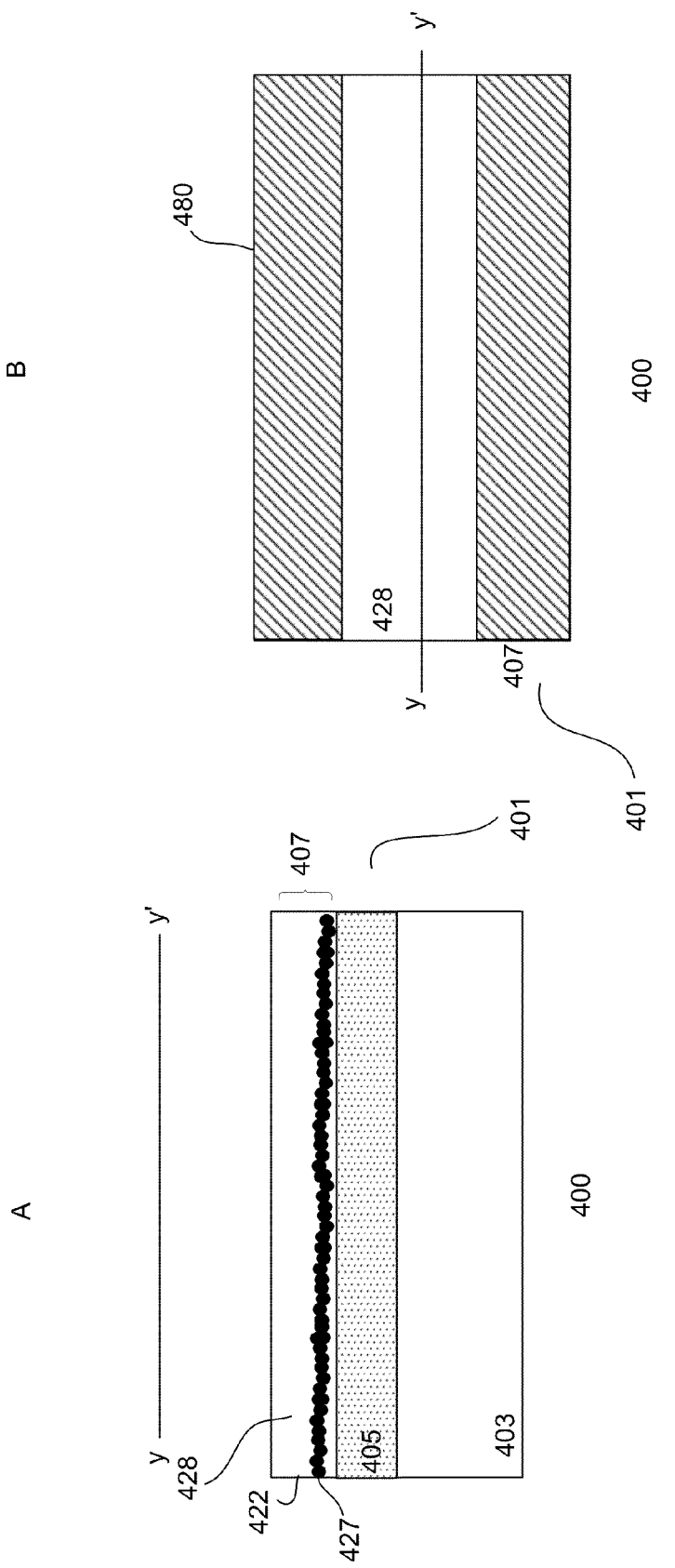
FIGS. 7a-c show cross-sectional and plan views of an alternative process for forming a device with nano-wires.
Figure 7B:
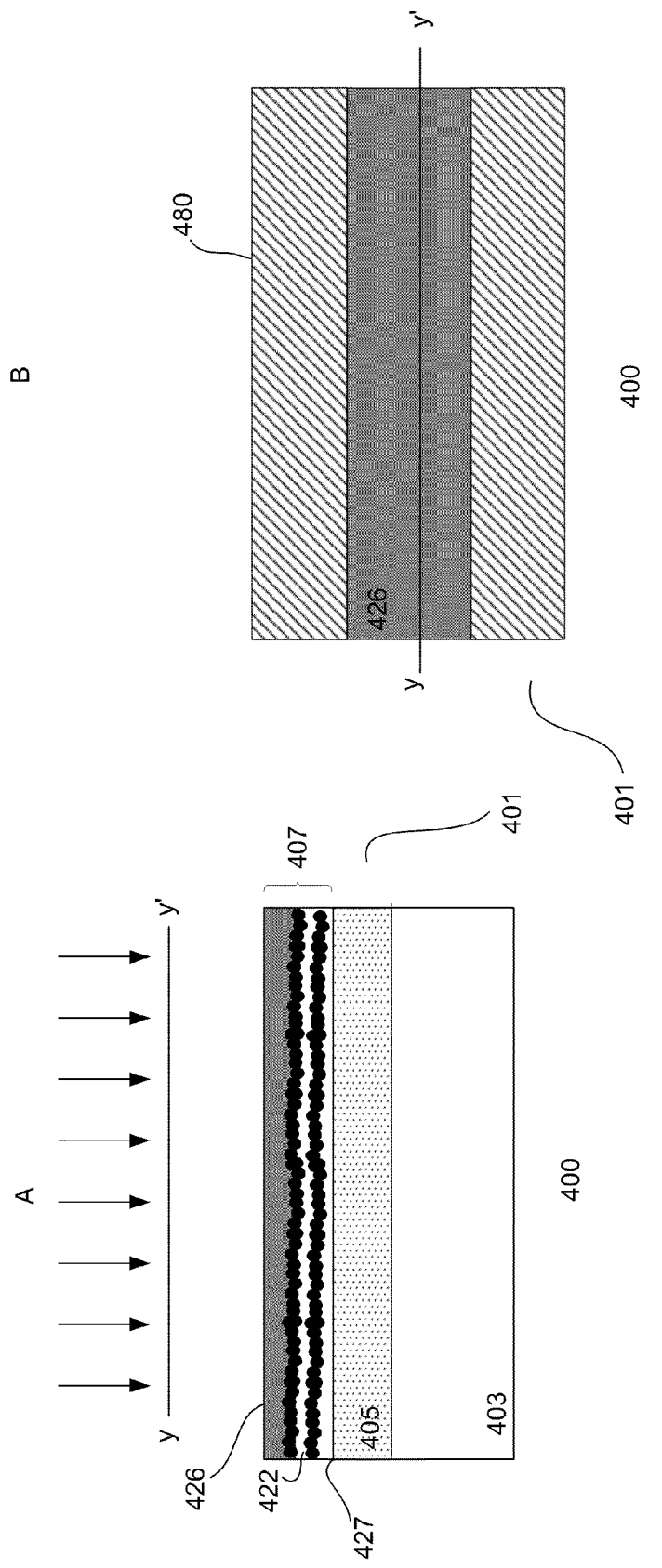
Figure 7C:
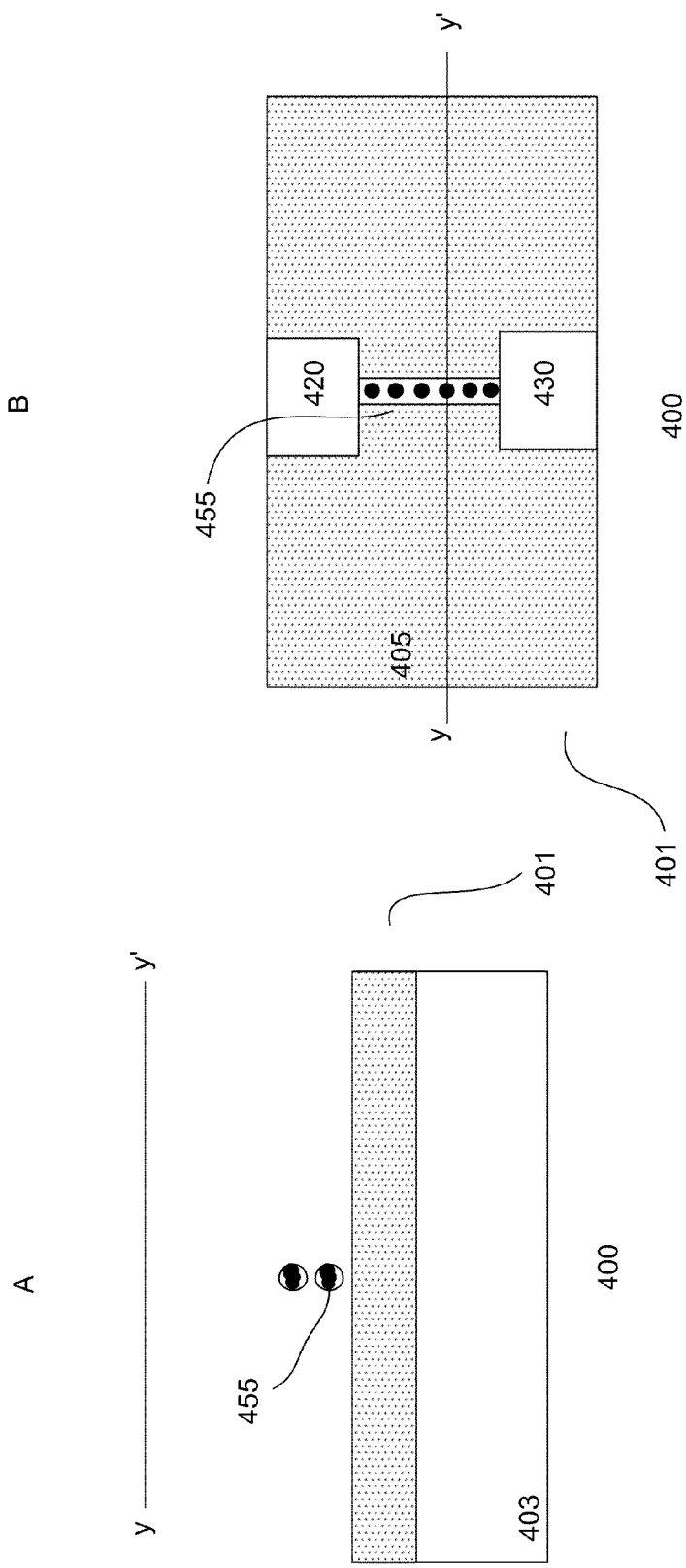

FIGS. 7a-c show cross-sectional (A) and plan (B) views of an embodiment of a process 400 for forming multiple nano-wires. As shown, a substrate 401 is at the stage of processing similar to that described in FIG. 4d. For example, the surface crystalline layer 407 includes EOR defects 422. The EOR defects are at a first depth of the surface crystalline layer. A mask 480, which serves as an implant mask for the PAI remains over the surface of the crystalline layer. After the PAI process, an anneal is performed to stabilize the EOR defects and recrystallize the amorphous material.

Referring to FIG. 7b, a second PAI is performed to create a second band of EOR defects $422_2$ at a second depth in the surface crystalline layer which is shallower than the first depth. The PAI implant forms an amorphous layer 426 above the band of EOR defects. An anneal is performed to recrystallize the amorphous material and to stabilize the second band of EOR defects. The process continues in a similar manner as described in FIG. 4d-4h to produce two nano-wires $455_{1-2}$ coupled to first and second contact regions 420 and 430, as shown in FIG. 7c. The nano-wires are arranged in a column format. The process then continues in a similar manner as described in FIG. 4i to form a SET having twin nano-wires arranged in column in the y direction. In other embodiments, the column may include other number of nano-wires.

The column of nano-wires can be formed by, for example, the use of a tall fin structure. The height to the width ratio of the fin structure may be greater than or equal to about 2:1. In one embodiment, the height to width ratio of the fin structure may be greater than or equal to 2:1 for a twin nano-wire column arrangement.

In other embodiments, the process of FIGS. 6a-c and FIGS. 7a-c may be combined to form a matrix of nano-wires, for example, as described in FIG. 3d. While FIG. 3d shows 2 horizontal and 2 vertically stacked nano-wires, it should be understood that multiple horizontal nano-wires could be combined with the 2 vertically stacked nano-wires. Furthermore, the processes of FIGS. 6a-c and 7a-c may be modified in a similar manner as described in FIGS. 5a-b. In addition, each nano-wire may be formed with a single row or multiple rows of nano-crystals or clusters. A single row of nano-crystals may be derived by a single PAI process while multiple rows of nano-crystals may be derived by multiple PAI processes. After each PAI process, an anneal is performed to recrystallize the amorphous material and to stabilize the EOR defects.

Figure 8:
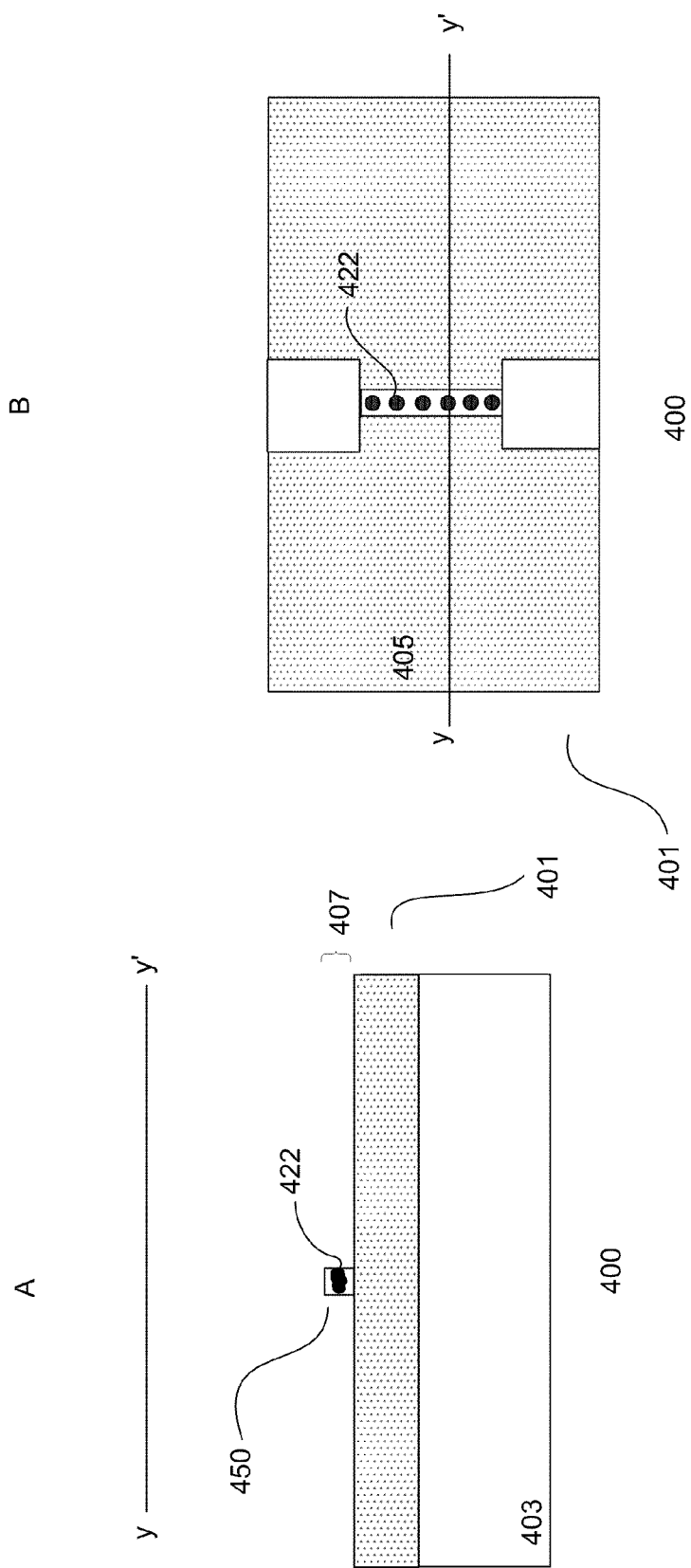
FIG. 8 shows cross-sectional and plan views of yet another process for forming a device with nano-wires.

FIG. 8 shows yet another embodiment of a process 400 for forming a nano-wire. As shown, a substrate 401 is at the stage of processing similar to that described in FIG. 4e. For example, a surface crystalline layer has been patterned to form a post 450. A mask used to pattern the surface crystalline layer to form the post has been removed. The post includes EOR defects 422. The EOR defects are formed by a PAI process followed by an anneal to stabilize the defects and to recrystallize amorphous material. The post may be formed before or after the PAI process.

In one embodiment, the post comprises a dimension which is about or substantially equal to the size of the nano-wire. For example, the height and width of the post is about 20-30 nm. For example, the surface crystalline layer may be formed with a height equal to about the size of the nano-wire. In the case of a COI substrate, the surface crystalline layer may be thinned to a height equal to about the size of the nano-wire. Providing a post equal to about the size of the nano-wire facilitates forming the nano-wire using a single oxidizing anneal to form the oxide support structure and nano-crystals or clusters. After the nano-wire is formed, the process continues as described in, for example, FIGS. 4h-i to form a SET.

In other embodiments, the process of FIG. 8 may be changed to form multiple nano-wires arranged in a row format, similar to that described in FIGS. 6a-c. Furthermore, the process of FIG. 8 may be selected to form a single row or multiple rows of nano-crystals or clusters in a nano-wire. A single row of nano-crystals may be derived by a single PAI process while multiple rows of nano-crystals may be derived by multiple PAI processes. After a PAI process, an anneal is performed to recrystallize the amorphous material and to stabilize the EOR defects.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method for fabricating a semiconductor device comprising:
providing a substrate with a surface crystalline layer over the substrate;
creating end-of-range (EOR) defects in the surface crystalline layer;
forming one or more fins with the EOR defects embedded within; and
oxidizing the one or more fins to form one or more nano-wires, wherein the EOR defects are transformed into nano-crystals within the core of the nano-wires.

2. The method of claim 1 wherein creating EOR defects comprises:
performing a pre-amorphization implant (PAI) on the surface crystalline layer to form an amorphous silicon layer above the surface crystalline layer; and
annealing the substrate to recrystallize the amorphous silicon layer as well as form EOR defects.

3. The method of claim 2, wherein the PAI implants Si+ or Ge+ ions at a dose from $1 \times 10^{15}$ cm$^{-2}$ to $1 \times 10^{17}$ cm$^{-2}$ into the surface crystalline layer and is performed at different energy levels to form EOR defects at different depths from the top of the surface crystalline layer.

4. The method of claim 2, wherein the PAI and annealing steps are repeatedly performed one after the other at different depths from the top of the surface crystalline layer for 2 or more times to form multiple levels of EOR defects thereby resulting in twin or multiple defect layered nano-wires.

5. The method of claim 2, wherein the PAI and annealing steps are performed one after the other at different depths from the top of the surface crystalline layer for 2 times to form a twin column of nano-wires.

6. The method of claim 2 wherein a soft mask with an anti-reflective coating beneath it is formed and patterned on the substrate surface before EOR defects are created in the surface crystalline layer.

7. The method of claim 6 wherein the soft mask is removed before the substrate is annealed to recrystallize the amorphous silicon layer as well as form EOR defects, wherein the anneal is a low temperature anneal and serves to stabilize the EOR defects by increasing the defects' resistance and dissolution stability.

8. The method of claim 1 wherein the one or more fins is formed before the EOR defects are created.

9. The method of claim 1 wherein forming the one or more fins comprises:
depositing a hard mask layer to selectively expose portions of the substrate to be removed;
etching the exposed portions to form one or more fins; and
removing the hard mask layer, wherein the usage of the hard mask allows for a more conformal sidewall etching.

10. The method of claim 1 wherein oxidation is achieved by subjecting the one or more fins to an anneal in an oxidizing ambient at the temperature of 1100° C. for 5 hours.

11. A method for fabricating a semiconductor device comprising:
providing a substrate with a surface crystalline layer over the substrate;
creating end-of-range (EOR) defects in the surface crystalline layer;
forming one or more fins with the EOR defects embedded within;
oxidizing the one or more fins;
removing the oxide from the one or more fins to form one or more nano-wires; and
oxidizing the one or more nano-wires to form one or more nano-wires, wherein the EOR defects are transformed into nano-crystals within the core of the nano-wires.

12. The method of claim 11 wherein the oxide is removed from the one or more fins and a pad region using a wet etch.

13. The method of claim 12 wherein the surface crystalline layer is patterned using a hard mask layer to form in the pad region a first and second contact pads coupled by the nano-wire.

14. The method of claim 13 wherein a gate layer is further deposited on the substrate and patterned to form a gate that is separated from the first and second contact pads and covers the nano-wire, wherein the gate layer is about 1300 A.

15. The method of claim 14 wherein the contact pads are doped when the gate is being formed, wherein the nano-wire covered by the gate serves as a channel of a SET.

16. The method of claim 11 wherein creating EOR defects comprises:
performing a pre-amorphization implant (PAI) on the surface crystalline layer to form an amorphous silicon layer above the surface crystalline layer; and
annealing the substrate to recrystallize the amorphous silicon layer as well as form EOR defects, wherein the PAI implants Si+ or Ge+ ions at a high dose from $1 \times 10^{15}$ cm$^{-2}$ to $1 \times 10^{17}$ cm$^{-2}$ into the surface crystalline layer and may be performed at different energy levels to form EOR defects at different depths from the top of the surface crystalline layer.

17. The method of claim 16, wherein the PAI and annealing steps may be performed one after the other at different depths from the top of the surface crystalline layer for 2 or more times to form multiple levels of EOR defects thereby resulting in twin or multiple defect layered nano-wires.

18. The method of claim 16 wherein the PAI does not fully amorphize the entire surface crystalline layer.

19. The method of claim 16 wherein the substrate may be patterned to form one or more fins using a hard mask prior to performing a PAI using a soft mask to form EOR defects.

20. The method of claim 11 wherein oxidation is achieved by subjecting the one or more fins to an anneal in an oxidizing ambient at the temperature of 1100° C. for 5 hours.

21. A method for fabricating a semiconductor device comprising:
providing a substrate with a surface crystalline layer over the substrate;
performing a pre-amorphization implant (PAI) on the surface crystalline layer to form an amorphous silicon layer above the surface crystalline layer, wherein end-of-range (EOR) defects are created at an interface of the surface crystalline layer and the amorphous silicon layer;
annealing the substrate to recrystallize the amorphous silicon layer;
depositing a hard mask layer to selectively expose portions of the substrate to be removed;
etching the exposed portions to form one or more fins;
removing the hard mask layer, wherein the usage of the hard mask allows for a more conformal sidewall etching; and
oxidizing the one or more fins to form one or more nano-wires, wherein the EOR defects are transformed into nano-crystals within the core of the nano-wires.

* * * * *